(12) United States Patent
Huang

(10) Patent No.: US 10,815,389 B2
(45) Date of Patent: Oct. 27, 2020

(54) PHOTOSENSITIVE AND VIA-FORMING CIRCUIT BOARD

(71) Applicant: Microcosm Technology Co. Ltd., Tainan (TW)

(72) Inventor: Tang-Chieh Huang, Tainan (TW)

(73) Assignee: Microcosm Technology Co., Ltd, Tainan (TW)

(*) Notice: Subject to any disclaimer, the term of this patent is extended or adjusted under 35 U.S.C. 154(b) by 410 days.

(21) Appl. No.: 15/457,949

(22) Filed: Mar. 13, 2017

(65) Prior Publication Data

US 2018/0263122 A1 Sep. 13, 2018

(51) Int. Cl.
| | | |
|---|---|---|
| *C09D 179/08* | (2006.01) | |
| *G03F 7/038* | (2006.01) | |
| *H05K 1/11* | (2006.01) | |
| *G03F 7/075* | (2006.01) | |
| *H05K 3/28* | (2006.01) | |
| *H05K 1/03* | (2006.01) | |
| *H05K 3/34* | (2006.01) | |

(52) U.S. Cl.
CPC ......... *C09D 179/08* (2013.01); *G03F 7/0387* (2013.01); *G03F 7/0757* (2013.01); *H05K 1/0393* (2013.01); *H05K 1/112* (2013.01); *H05K 3/287* (2013.01); *H05K 3/3452* (2013.01); *H05K 2201/0154* (2013.01); *H05K 2201/0959* (2013.01); *H05K 2203/0582* (2013.01); *Y10T 428/31681* (2015.04); *Y10T 428/31721* (2015.04)

(58) Field of Classification Search
CPC ... C09D 179/08; G03F 7/0757; G03F 7/0387; H05K 1/112; H05K 1/0393; H05K 2203/0582; H05K 3/3452; H05K 2201/0959; H05K 3/287; H05K 2201/0154; Y10T 428/31681; Y10T 428/31721

See application file for complete search history.

(56) References Cited

U.S. PATENT DOCUMENTS

| | | | | |
|---|---|---|---|---|
| 3,888,827 | A * | 6/1975 | Matueda | C08G 59/4042 525/523 |
| 6,467,160 | B1 * | 10/2002 | Cummings | H05K 3/0094 29/831 |
| 2004/0235992 | A1 * | 11/2004 | Okada | C08F 2/50 524/115 |

(Continued)

*Primary Examiner* — John D Freeman
(74) *Attorney, Agent, or Firm* — Haverstock & Owens LLP

(57) ABSTRACT

A photosensitive and via-forming circuit board comprising a laminate unit, a conductor unit, and a cover layer unit is provided. The laminate unit includes an insulating layer, a first conductive wiring layer and a second conductive wiring layer formed at two opposite sides of the insulating layer, respectively, and at least one through-hole surface defining a through hole extending from the upper surface of the first conductive wiring layer through the insulating layer to the lower surface of the second conductive wiring layer. The conductor unit is formed on the at least one through-hole surface. The cover layer unit is formed from a photosensitive composition comprising an epoxy group-containing compound and a photosensitive polyimide capable of reacting with the epoxy group of the epoxy group-containing compound, and includes a first cover layer formed on the first conductive wiring layer and extending into and filling the through hole.

8 Claims, 20 Drawing Sheets

(56) References Cited

U.S. PATENT DOCUMENTS

2005/0208708 A1* 9/2005 Jiao ................... H05K 3/0061
                                                                       438/118
2007/0130761 A1* 6/2007 Kang ................... H05K 3/428
                                                                       29/830

* cited by examiner

US 10,815,389 B2

PHOTOSENSITIVE AND VIA-FORMING CIRCUIT BOARD

BACKGROUND OF THE INVENTION

Field of the Invention

The present invention relates to a circuit board and, more particularly, to a photosensitive and via-forming circuit board.

Description of the Prior Art

Referring to FIG. 1, a printed circuit board was disclosed in the Taiwan patent publication No. 201316858, which comprised a laminate 1 defining a plurality of electrical through holes 11 that are spaced, the photosensitive solder resist 2 filling the electrical through holes 11, and two solder resist layers 3 formed at two opposite sides of the laminate 1. The laminate 1 included an insulating substrate 12 and two wiring conductor layers 13 formed at two opposite sides of the insulating substrate 12. However, the main materials of the photosensitive solder resist 2 and the solder resist layers 3 described in the patent application were generally photocurable epoxy resins, such that the heat resistance and flexibility of the printed circuit board were poor and couldn't meet the industry's needs. Therefore, there exists a need for those skilled in the art to make a breakthrough in the topics of improving the printed circuit board for obtaining better heat resistance and flexibility.

SUMMARY OF THE INVENTION

Therefore, an object of the present invention is to provide a photosensitive and via-forming circuit board. After being subjected to the lithography process, the photosensitive and via-forming circuit board can be formed into a circuit board formed with the photosensitive opening and having heat resistance and flexibility.

Accordingly, the photosensitive and via-forming circuit board of the present invention comprises a laminate unit, a conductor unit, and a cover layer unit. The laminate unit includes an insulating layer, a first conductive wiring layer and a second conductive wiring layer formed at two opposite sides of the insulating layer, respectively, and at least one through-hole surface. The at least one through-hole surface defines a through hole extending from the upper surface of the first conductive wiring layer through the insulating layer to the lower surface of the second conductive wiring layer. The conductor unit is formed on the at least one through-hole surface and electrically connects the first conductive wiring layer and the second conductive wiring layer. The cover layer unit includes a first cover layer formed on the first conductive wiring layer of the laminate unit and extending into and filling the through hole. The cover layer unit is formed from a photosensitive composition, and the photosensitive composition comprises an epoxy group-containing compound and a photosensitive polyimide capable of reacting with the epoxy group of the epoxy group-containing compound.

<Laminate Unit>

The insulating layer is, for example, but not limited to, an epoxy resin layer, a polyimide resin layer, a polyester resin layer, a fluorine-containing resin layer, or a liquid crystal type polymer layer. Preferably, the insulating layer is a flexible insulating layer. Preferably, the insulating layer is a polyimide resin layer. The thickness of the insulating layer is not particularly limited and may be varied depending on the application requirements of the photosensitive and via-forming circuit board, such that the photosensitive and via-forming circuit board or the circuit board having the photosensitive opening and formed from the photosensitive and via-forming circuit board subjected to the lithography process has better flexibility. Preferably, the thickness of the insulating layer ranges from 5 μm to 50 μm.

The material of the first conductive wiring layer and the second conductive wiring layer is, for example, but not limited to, a conductive metal, a conductive polymer, or a composite material containing a conductive metal and a polymer. The conductive metal is, for example, but not limited to, copper, aluminum, gold, silver, or a composite metal. Preferably, the conductive metal is copper. The thickness of the first conductive wiring layer and the second conductive wiring layer is not particularly limited and may be varied depending on the application requirements of the photosensitive and via-forming circuit board, such that the photosensitive and via-forming circuit board or the circuit board having the photosensitive opening and formed from the photosensitive and via-forming circuit board subjected to the lithography process is thinned and the etching line thereof is miniaturized. Preferably, the thickness of the first conductive wiring layer and the second conductive wiring layer ranges from 3 μm to 50 μm.

The hole diameter of the through hole is not particularly limited and may be varied depending on the application requirements of the photosensitive and via-forming circuit board, such that the density of the electrically connecting lines of the first conductive wiring layer and the second conductive wiring layer of the photosensitive and via-forming circuit board is increased. Preferably, the hole diameter of the through hole ranges from greater than 0 mm to 0.25 mm. It is to be noted that the number of the through hole is not limited to one, and may be varied depending on the application requirements of the photosensitive and via-forming circuit board. In the other variant aspects of the present invention, the number of the through hole may be two, three, four, etc. The number of the at least one through-hole surface is varied depending on the number requirement of the through hole and, therefore, is not limited to one and may be two, three, four, etc. in the other variant aspects of the present invention.

<Conductor Unit>

The material of the conductor unit is, for example, but not limited to, conductive metal or conductive polymer. The conductive metal is, for example, but not limited to, copper etc. The manner by which the conductor unit is formed on the at least one through-hole surface can be a conventional manner such as, but not limited to, the chemical plating method or the like.

<Cover Layer Unit>

The thickness of the first cover layer is not particularly limited and may be varied depending on the application requirements of the photosensitive and via-forming circuit board, such that the first cover layer has a preferred volume resistivity, and the circuit board having the photosensitive opening and formed from the photosensitive and via-forming circuit board subjected to the lithography process has a high value of breakdown voltage, resulting in the better insulation property. Preferably, the thickness of the first cover layer ranges from 5 µm to 50 µm.

The cover layer unit further includes a second cover layer formed on the second conductive wiring layer of the laminate unit and extending into and filling the through hole. The thickness of the second cover layer is not particularly limited and may be varied depending on the application requirements of the photosensitive and via-forming circuit board, such that the second cover layer has a preferred volume resistivity, and the circuit board having the photosensitive opening and formed from the photosensitive and via-forming circuit board subjected to the lithography process has a high value of breakdown voltage, resulting in a better insulation property. Preferably, the thickness of the second cover layer ranges from 5 µm to 50 µm.

The cover layer unit not only protects the first conductive wiring layer and the second conductive wiring layer of the laminate unit from oxidation, but also forms the cover layer unit having the photosensitive opening by performing the lithography process, such that the first conductive wiring layer or the second conductive wiring layer is exposed from the photosensitive opening for assembling, welding or layering process. The size of the photosensitive opening is small, as compared to that of the opening formed by using mechanical drilling or laser drilling, and can meet the need of minimizing the opening for the industry. In addition, the cover layer unit can also serve as a plug piece for the through hole of the laminate unit to prevent air from being present in the through hole and resulting in the thermal expansion and contraction effect, which may deteriorate the dimensional stability of the photosensitive and via-forming circuit board and even deforms the circuit board.

The manner in which the cover layer unit is formed on the laminate unit is to form the photosensitive composition on the first conductive wiring layer and the second conductive wiring layer of the laminate unit via the coating procedure, during which the photosensitive composition flows into the through hole and fills the through hole simultaneously. Then, the baking treatment is performed so that the solvent in the photosensitive composition is removed. The coating procedure is, for example, but not limited to, spin coating, roller coating, screen coating, curtain coating, dip coating, or spray coating, etc. The temperature and duration of the baking treatment are not particularly limited and may be varied depending on the kind of the solvent in the photosensitive composition for facilitating the removal of the solvent or to shape the cover layer unit. In order to reduce the reaction between the epoxy group-containing compound and the photosensitive polyimide in the cover layer unit, it is preferable that the temperature of the baking treatment ranges from 70° C. to 120° C.

[Photosensitive Composition]

The photosensitive composition comprises an epoxy group-containing compound and a photosensitive polyimide capable of reacting with the epoxy group of the epoxy group-containing compound.

<<Epoxy Group-Containing Compound>>

In order to decrease the amount of the solvent and thus increasing the solid content of the photosensitive composition and reducing the volume shrinkage of the cover layer unit simultaneously, the epoxy group-containing compound is preferably a liquid epoxy group-containing compound. The epoxy group-containing compound may be used alone or in combination, and the epoxy group-containing compound is, for example, but not limited to, neopentyl glycol diglycidyl ether, 1,4-butanediol diglycidyl ether, diglycidyl 1,2-cyclohexanedicarboxylate, bisphenol A diglycidyl ether, 1,2-propanediol diglycidyl ether, trimethylolpropane triglycidyl ether, glycerol propoxylate triglycidyl ether, resorcinol diglycidyl ether, or dimer acid diglycidyl ester represented by formula (1),

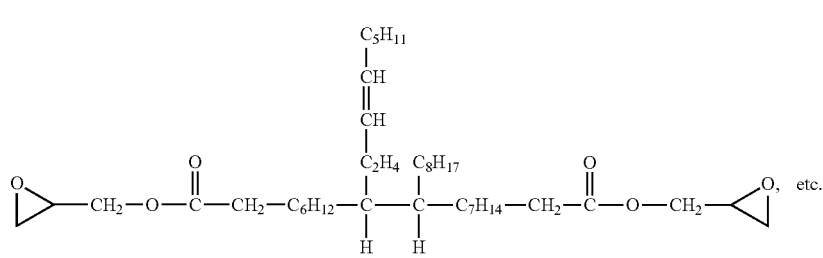

In order to make the circuit board having the photosensitive opening have better heat resistance and acid resistance, preferably, the content of the epoxy group-containing compound ranges from 10 wt % to 70 wt %, based on 100 wt % of the photosensitive polyimide.

<<Photosensitive Polyimide>>

The photosensitive polyimide can carry out a photocrosslinking reaction and can react with the epoxy group-containing compound during the baking treatment after the development step in the lithographic process. In addition to having the photosensitive group (e.g., a double bond), the photosensitive polyimide also has at least one reactive functional group capable of reacting with the epoxy group of the epoxy group-containing compound, and the at least one reactive functional group is, for example, but not limited to, carboxylic acid group (—COOH) or amine group (-NH$_2$), etc. The photosensitive polyimide is, for example, the soluble polyimide having a photosensitive group and a carboxylic acid group. In order to have a better developing property during the development step in the lithography process, preferably, the photosensitive polyimide has the structure of formula (I);

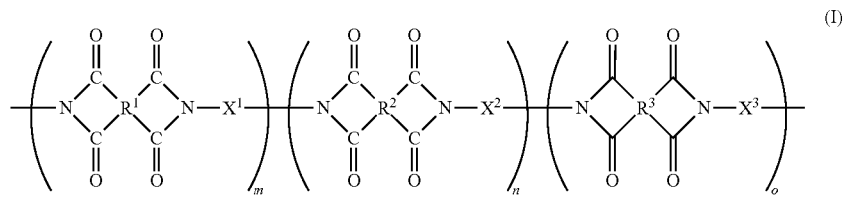

$R^1$, $R^2$ and $R^3$ are each a tetravalent group;
$X^1$ is a divalent group;
$X^2$ is a divalent group having a carboxylic acid group;
$X^3$ is a divalent group having (2-hydroxyl-3-acrylate)propyl group or a divalent group having (2-hydroxyl-3-methacrylate)propyl group;
m is a positive integral from 30 to 70, n is a positive integral from 10 to 45, and o is a positive integral from 10 to 35, based on 100 of the sum of m+n+o;
wherein the plural $R^1$s are the same or different, the plural $X^1$s are the same or different, the plural $R^2$s are the same or different, the plural $X^2$s are the same or different, the plural $R^3$s are the same or different, and the plural $X^3$s are the same or different.

The tetravalent group is, for example, but not limited to,

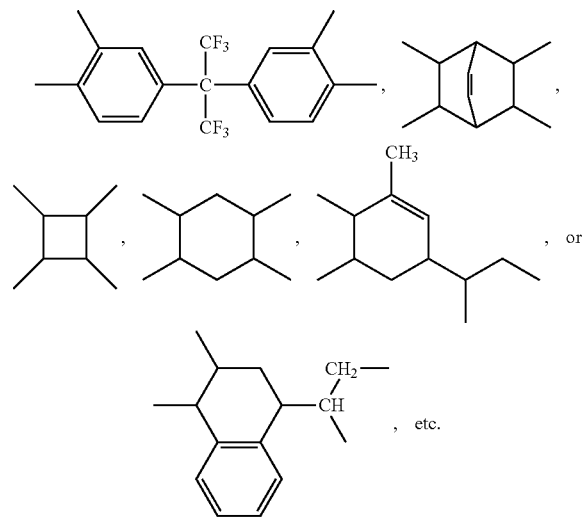

, etc.

The divalent group is, for example, but not limited to,

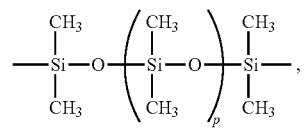

wherein p is from 1 to 20,

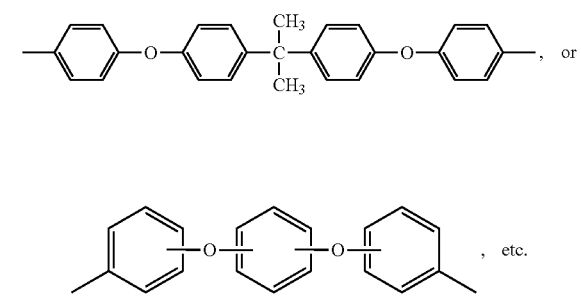

, or

, etc.

The divalent group having the carboxylic acid group (—COOH) is, for example, but not limited to,

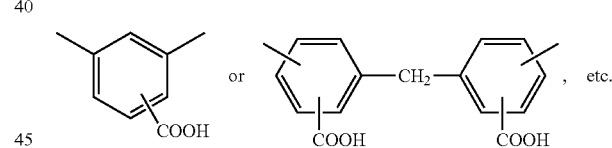

, etc.

The divalent group having (2-hydroxyl-3-acrylate)propyl group is, for example, but not limited to,

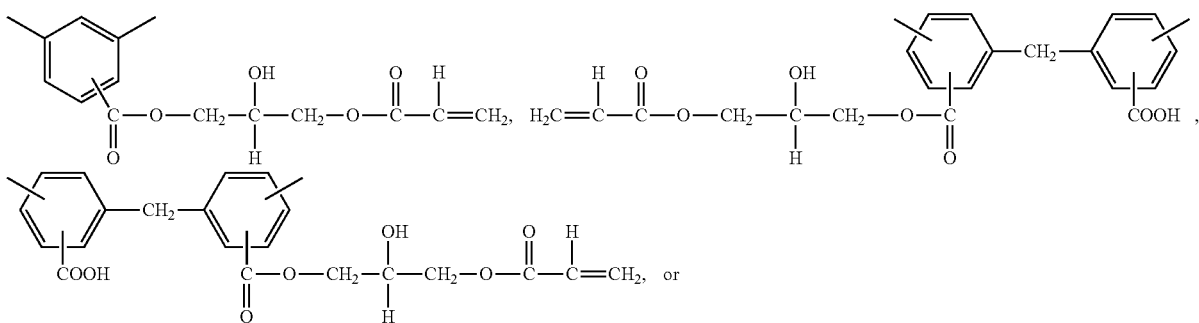

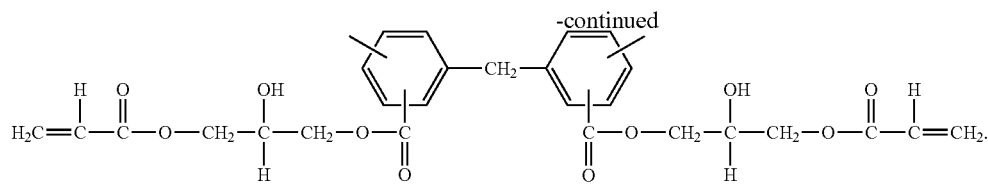

The divalent group having (2-hydroxyl-3-methacrylate) propyl group is, for example, but not limited to,

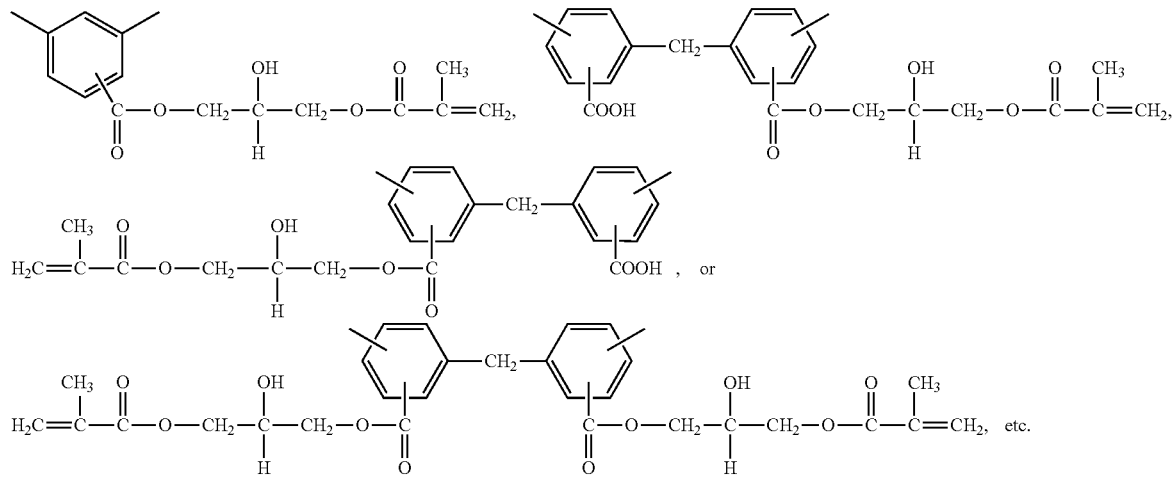

The method for preparing the photosensitive polyimide having the structure of formula (I) comprises the following steps: reacting the tetracarboxylic acid dianhydride-based compound with the diamine-based component to form the polyamic acid mixture, wherein the diamine component comprises a diamine compound having a carboxylic acid group and other diamine compounds; adding a catalyst to the polyamic acid mixture to carry out a chemical cyclization reaction for forming the polyimide, wherein the catalyst and the temperature of the chemical cyclization reaction may be that commonly used in the preparation of thermal polyimide by the chemical cyclization method; then, adding glycidyl (meth) acrylate to make the epoxy group in the glycidyl (meth)acrylate react with the carboxylic acid group of the polyimide between 60° C. and 130° C. to form the photosensitive polyimide having the structure of formula (I). The glycidyl (meth) acrylate refers to glycidyl acrylate or glycidyl methacrylate. The tetracarboxylic acid dianhydride-based compound is not particularly limited, and can be the tetracarboxylic dianhydride-based compound used in the art. The tetracarboxylic acid dianhydride-based compound is, for example, but not limited to, bicyclo[2,2,2]oct-7-ene-2, 3,5,6-tetracarboxylic dianhydride, 5-(2,5-dioxotetrahydro-3-furanyl)-3-methyl-3-cyclohexene-1,2-dicarboxylic anhydride, cyclobutane-1,2,3,4-tetracarboxylic dianhydride, or 4,4'-(hexafluoroisopropylidene)diphthalic anhydride, etc. The diamine compound having the carboxylic acid group is, for example, but not limited to, 3,5-diaminobenzoic acid or 2,2-bis[4-(4-aminophenoxy)phenyl]propane, etc. The other diamine compound is not particularly limited, and can be the diamine compound used in the art. The other diamine compound is, for example, but not limited to, 1,3-bis(4'-aminophenoxy)benzene or bisaminopropyltetramethyldisiloxane, etc.

When the photosensitive and via-forming circuit board of the present invention is subjected to the lithography process to form the cover layer unit having the photosensitive opening, preferably, the photosensitive composition further comprises a photo initiator to accelerate the photo-crosslinking reaction of the photosensitive polyimide.

<<Photo Initiator>>

The photo initiator can be used alone or in combination, and the photo initiator is, for example, but not limited to, phenyl bis(2,4,6-trimethylbenzoyl)-phosphine oxide, 2-benzyl-2-dimethylamino-1-(4-morpholinophenyl)-1-butanone, (2,4,6-trimethyl benzoyl)diphenyl phosphine oxide, bis (.eta.5-2,4-cyclopentadien-1-yl)-bis(2,6-difluoro-3-(1H-pyrrol-1-yl)-phenyl titanium, 4,4'-bis(dimethylamino)benzophenone, 4,4'-bis(diethylamino)benzophenone, or N-phenyldiethanolamine, etc. Preferably, the content of the photo initiator ranges from 0.1 wt % to 30 wt %, based on 100 wt % of the photosensitive polyimide.

In order to make the photosensitive composition have good flowability, it is preferable that the photosensitive composition further contains a solvent. Preferably, the solid content of the photosensitive composition is in the range of 40 wt % to 90 wt %, based on 100 wt % of the total amount of the photosensitive composition.

<<Solvent>>

The solvent is, for example, but not limited to, aprotic solvents and the like. To enhance the photo-crosslinking reaction of the photosensitive polyimide, it is preferable that the solvent is the aprotic solvent. The aprotic solvent can be used alone or in combination, and is, for example, but not limited to, N-methyl-2-pyrrolidone (NMP), N,N-dimethylacetamide (DMAc), γ-butyrolactone (GBL), xylene, or toluene, etc.

The photosensitive and via-forming circuit board of the present invention is subjected to the lithography process including exposure, development, and baking. During the exposure, the photosensitive polyimide in the photosensitive composition of the cover layer unit undergoes the photo-crosslinking reaction. During the development, the exposed portions of the cover layer unit are retained, and the unexposed portions of the cover layer unit are removed to form the photosensitive opening. During the baking, the reactive functional group, such as the carboxylic acid group of the photosensitive polyimide, which has been photo-crosslinked, in the photosensitive composition is caused to react with the epoxy group of the epoxy group-containing compound, and, simultaneously, the moisture or solvent therein is removed for obtaining the circuit board having the photosensitive opening. The light used for the exposure is, for example, but not limited to, X-rays, electron beams, ultraviolet rays, or visible rays. The developer used for the development is, for example, but not limited to, the inorganic base, the organic amine, or the quaternary ammonium salt. The inorganic base is, for example, but not limited to, sodium carbonate, potassium hydroxide, or sodium hydroxide, etc. The organic amine is, for example, but not limited to, the primary amine organic compound, the secondary amine organic compound, or the tertiary amine organic compound, etc. The primary amine organic compound is, for example, but not limited to, ethylamine and the like. The secondary amine organic compound is, for example, but not limited to, diethylamine and the like. The tertiary amine organic compound is, for example, but not limited to, triethylamine and the like. The quaternary ammonium salt is, for example, but not limited to, tetramethylammonium hydroxide (TMAH), and the like. To facilitate the reaction between the photosensitive polyimide and the epoxy group-containing compound, it is preferred that the baking temperature ranges from 150° C. to 250° C. In the infrared absorption spectrum analysis of the cover layer unit having the photosensitive opening in the circuit board having the photosensitive opening, there are absorption peaks of the acyl group (C=O in plane) in the imide group from 1769 to 1778 cm$^{-1}$, the acyl group (C=O out of plane) in the imide group from 1702 to 1708.6 cm$^{-1}$, C—N—C in the imide group from 1383 to 1394.4 cm$^{-1}$, C—Si in the imide group from 1254 to 1259 cm$^{-1}$ and from 791 to 795.1 cm$^{-1}$, and —OH from 3416 to 3472.3 cm$^{-1}$.

The efficacy of the invention lies in that the cover layer unit can not only protect the first conductive wiring layer and the second conductive wiring layer, but also serve as the plug piece in the through hole of the laminate unit. After the lithography process for the photosensitive and via-forming circuit board of the present invention, the cover layer unit is formed with the photosensitive opening, in which the photosensitive composition is filled to enhance the heat resistance and flexibility of the circuit board having the photosensitive opening.

BRIEF DESCRIPTION OF THE DRAWINGS

Other features and effects of the present invention will be clearly presented in the detailed description with reference to the drawings, in which.

DETAILED DESCRIPTION OF THE EMBODIMENTS

Figure 1:
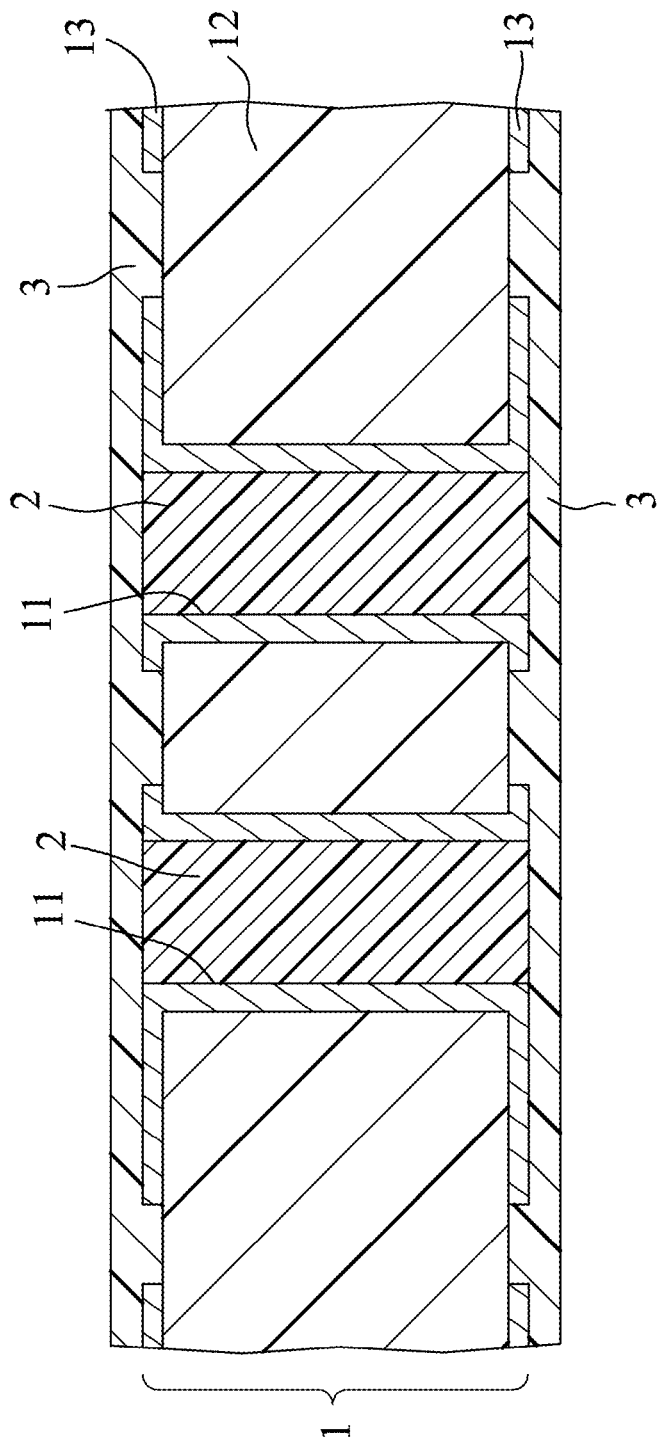
FIG. 1 is a schematic cross-section view of a traditional printed circuit board.

The present invention will be further clarified in terms of the following embodiments. It is to be understood, however, that those embodiments are merely illustrative and should not be construed as limitation to the practice of the present invention.

Synthesis Example 1

16.95 g (0.111 mol) of 3,5-diaminobenzoic acid, 13.07 g (0.032 mol) of 2,2-bis[4-(4-aminophenoxy)phenyl]propane, 75.60 g (0.080 mol) of bisaminopropyltetramethyldisiloxane, and 126.72 g of N-methyl-2-pyrrolidone were mixed to form a homogeneous mixture. 46.61 g (0.188 mol) of bicyclo[2,2,2]oct-7-ene-2,3,5,6-tetracarboxylic dianhydride was added to the homogeneous mixture, which was then mixed for 2 hours. Afterwards, 14.85 g (0.033 mol) of 4,4'-(hexafluoroisopropylidene)diphthalic anhydride was added and mixed for 4 hours at room temperature. After that, 65 g of xylene was added and then heated to the temperature for the polymerization reaction and mixed for 3 to 6 hours. After the temperature was down to 80° C., 7.92 g (0.056 mol) of glycidyl (meth)acrylate was added and then mixed between 80° C. to 120° C. for 12 hours. Next, the temperature was down to 25° C. and 301.72 g of the constituent containing the photosensitive polyimide was obtained. The solid content of the constituent containing the photosensitive polyimide was 58 wt % [(16.95+13.07+75.60+46.61+14.85+7.92)×100/(16.95+13.07+75.60+46.61+14.85+7.92+126.72)], and the content of the photosensitive polyimide was 58 wt % [(16.95+13.07+75.60+46.61+14.85+7.92)×100/(16.95+13.07+75.60+46.61+14.85+7.92+126.72)], based on 100 wt % of the total amount of the constituent containing the photosensitive polyimide.

Synthesis Example 2

16.45 g (0.108 mol) of 3,5-diaminobenzoic acid, 6.77 g (0.032 mol) of 1,3-bis(4'-aminophenoxy)benzene, 80.70 g (0.085 mol) of bisaminopropyltetramethyldisiloxane, and 168.14 g of N-methyl-2-pyrrolidone were mixed to form a homogeneous mixture. 46.93 g (0.178 mol) of 5-(2,5-dioxotetrahydro-3-furanyl)-3-methyl-3-cyclohexene-1,2-dicarboxylic anhydride was added to the homogeneous mixture, which was then mixed for 2 hours. Afterwards, 16.46 g (0.037 mol) of 4,4'-(hexafluoroisopropylidene)diphthalic anhydride was added and mixed for 4 hours at room temperature. After that, 65 g of xylene was added and then heated to the temperature for the polymerization reaction and mixed for 3 to 6 hours. After the temperature was down to 80° C., 7.68 g (0.054 mol) of glycidyl (meth)acrylate was added and then mixed between 80° C. to 120° C. for 12 hours. Next, the temperature was down to 25° C. and 343.13 g of the constituent containing the photosensitive polyimide was obtained. The solid content of the constituent containing the photosensitive polyimide was 50.998 wt % [(16.45+ 6.77+80.70+46.93+16.46+7.68)×100/(16.45+6.77+80.70+ 46.93+16.46+7.68+168.14)], and the content of the photosensitive polyimide was 50.998 wt % [(16.45+6.77+80.70+ 46.93+16.46+7.68)×100/(16.45+6.77+80.70+46.93+16.46+ 7.68+168.14)], based on 100 wt % of the total amount of the constituent containing the photosensitive polyimide.

Synthesis Example 3

18.62 g (0.122 mol) of 3,5-diaminobenzoic acid, 17.94 g (0.044 mol) of 2,2-bis[4-(4-aminophenoxy)phenyl]propane, 74.73 g (0.079 mol) of bisaminopropyltetramethyldisiloxane, and 231.98 g of N-methyl-2-pyrrolidone were mixed to form a homogeneous mixture. 41.82 g (0.213 mol) of cyclobutane-1,2,3,4-tetracarboxylic dianhydride was added to the homogeneous mixture, which was then mixed for 2 hours. Afterwards, 13.20 g (0.030 mol) of 4,4'-(hexafluoroisopropylidene)diphthalic anhydride was added and mixed for 4 hours at room temperature. After that, 65 g of xylene was added and then heated to the temperature for the polymerization reaction and mixed for 3 to 6 hours. After the temperature was down to 80° C., 8.70 g (0.061 mol) of glycidyl (meth)acrylate was added and then mixed between 80° C. to 120° C. for 12 hours. Next, the temperature was down to 25° C. and 406.99 g of the constituent containing the photosensitive polyimide was obtained. The solid content of the constituent containing the photosensitive polyimide was 43.00 wt % [(18.62+17.94+74.73+41.82+13.20+ 8.70)×100/(18.62+17.94+74.73+41.82+13.20+8.70+ 231.98)], and the content of the photosensitive polyimide was 43.00 wt % [(18.62+17.94+74.73+41.82+13.20+8.70)× 100/(18.62+17.94+74.73+41.82+13.20+8.70+231.98)], based on 100 wt % of the total amount of the constituent containing the photosensitive polyimide.

Preparation Example 1: Photosensitive Composition 41.48 g of bisphenol A diglycidyl ether, 3.37 g of phenyl bis(2,4,6-trimethylbenzoyl)-phosphine oxide (Manufacturer: BASF; brand name: Irgacure® 819), and 301.72 g of the constituent containing the photosensitive polyimide from the Synthesis Example 1 were mixed. The solid content of the photosensitive composition was 63.44 wt % [(41.48+ 3.37+175)×100/(41.48+3.37+301.72)], and the content of the photosensitive polyimide was 50.49 wt % [175×100/ (41.48+3.37+301.72)], based on 100 wt % of the total amount of the photosensitive composition.

Preparation Examples 2 to 6

The steps for preparing the photosensitive compositions of Preparation Examples 2 to 6 were the same as those for Preparation Example 1, except that the kind and amount of the epoxy resin were varied as shown in Table 1.

Preparation Example 7: Photosensitive Composition 52.15 g of bisphenol A diglycidyl ether, 3.37 g of phenyl bis(2,4,6-trimethylbenzoyl)-phosphine oxide, and 343.13 g of the constituent containing the photosensitive polyimide from Synthesis Example 2 were mixed. The solid content of the photosensitive composition was 57.82 wt % [(52.15+ 3.37+174.99)×100/(52.15+3.37+343.13)], and the content of the photosensitive polyimide was 43.90 wt % [174.99× 100/(52.15+3.37+343.13)], based on 100 wt % of the total amount of the photosensitive composition.

Preparation Examples 8 to 9

The steps for preparing the photosensitive compositions of Preparation Examples 8 to 9 were the same as those for Preparation Example 7, except that the kind and amount of the epoxy resin were varied as shown in Table 1.

Preparation Example 10: Photosensitive Composition 67.90 g of dimer acid diglycidyl ester represented by formula (1) above, 3.37 g of phenyl bis(2,4,6-trimethylbenzoyl)-phosphine oxide, and 406.99 g of the constituent containing the photosensitive polyimide from Synthesis Example 3 were mixed. The solid content of the photosensitive composition was 51.50 wt % [(67.90+3.37+175.01)× 100/(67.90+3.37+406.99)], and the content of the photosensitive polyimide was 36.59 wt % [175.01×100/(67.90+3.37+ 406.99)], based on 100 wt % of the total amount of the photosensitive composition.

Preparation Example 11

The steps for preparing the photosensitive compositions of Preparation Example 11 were the same as those for Preparation Example 10, except that the kind and amount of the epoxy resin were varied as shown in Table 1.

Preparation Example 12: Photosensitive Composition 3.37 g of phenyl bis(2,4,6-trimethylbenzoyl)-phosphine oxide, and 301.72 g of the constituent containing the photosensitive polyimide from Synthesis Example 1 were mixed. The solid content of the photosensitive composition was 58.46 wt % [(3.37+175)×100/(3.37+301.72)], and the content of the photosensitive polyimide was 57.36 wt % [175×100/(3.37+301.72)], based on 100 wt % of the total amount of the photosensitive composition.

Preparation Examples 13 to 14

The steps for preparing the photosensitive compositions of Preparation Examples 13 to 14 were the same as those for Preparation Example 12, except that the kind and amount of the constituent containing the photosensitive polyimide were varied as shown in Table 1.

Embodiment 1: Photosensitive and Via-Forming Circuit Board

Figure 2:
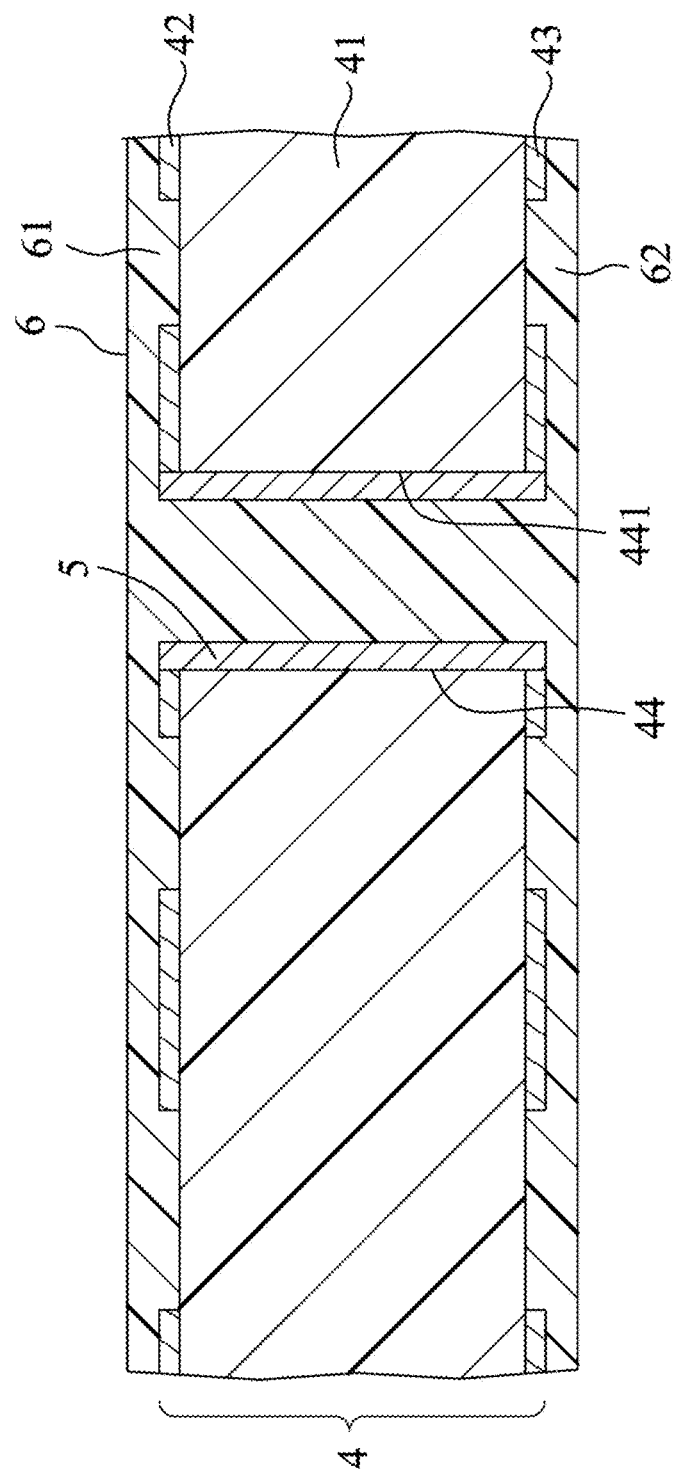
FIG. 2 is a schematic cross-section view of the first embodiment of the photosensitive and via-forming circuit board of the present invention.

Referring to FIG. 2, the first embodiment of the photosensitive and via-forming circuit board of the present invention includes a laminate unit 4, a copper conductor unit 5, and a cover layer unit 6. The laminate unit 4 includes a polyimide insulating layer 41, a first circuitized copper conductive layer 42 and a second circuitized copper conductive layer 43 formed at two opposite sides of the polyimide insulating layer 41, respectively, and a through-hole surface 44. The through-hole surface 44 defines a through hole 441 extending from the upper surface of the first circuitized copper conductive layer 42 to the lower surface of the second circuitized copper conductive layer 43. The cover layer unit 6 includes a first cover layer 61 and a second cover layer 62 formed on the first circuitized copper conductive layer 42 and the second circuitized copper conductive layer 43, respectively, and extending into and filling the through hole.

The method of preparing the first embodiment comprised the step of providing a laminate including a laminate unit 4 and a copper conductor unit 5. The laminate unit 4 included a polyimide insulating layer 41 having a thickness of 12 μm, a first circuitized copper conductive layer 42 having a thickness of 12 μm and a second circuitized copper conductive layer 43 having a thickness of 12 μm formed at two opposite sides of the polyimide insulating layer 41, respectively, and a through-hole surface 44. The through-hole surface 44 defined a through hole 441 extending from the upper surface of the first circuitized copper conductive layer 42 to the lower surface of the second circuitized copper conductive layer 43 and having a hole diameter of 0.1 mm. The copper conductor unit 5 was formed on the through-hole surface by chemical plating for electrically connecting the first circuitized copper conductive layer 42 and the second circuitized copper conductive layer 43. The photosensitive composition from Preparation Example 1 was coated on the first circuitized copper conductive layer 42 and the second circuitized copper conductive layer 43, filling the through hole 441, and baked in an oven with hot air at 80° C. for 10 minutes to obtain a first cover layer 61 having a thickness of 20 μm and a second cover layer 62 having a thickness of 20 μm. The first cover layer 61 and the second cover layer 62 formed the cover layer unit 6.

Embodiments 2 to 11 and Comparative Embodiments 1 to 3

The steps for preparing the photosensitive and via-forming circuit boards of Embodiments 2 to 11 and Comparative Embodiments 1 to 3 were the same as those for Embodiment 1, except that the kind of the photosensitive composition was varied, as shown in Table 1.

Comparative Embodiment 4

The steps for preparing the photosensitive and via-forming circuit board of Comparative Embodiment 4 were the same as those for the Embodiment 1, except that the photosensitive composition was photosensitive epoxy resin (Manufacturer: TAYIO INK; model number: PSR-4000 EG23; solid content: 79 wt %).

Application Example 1

Figure 3:
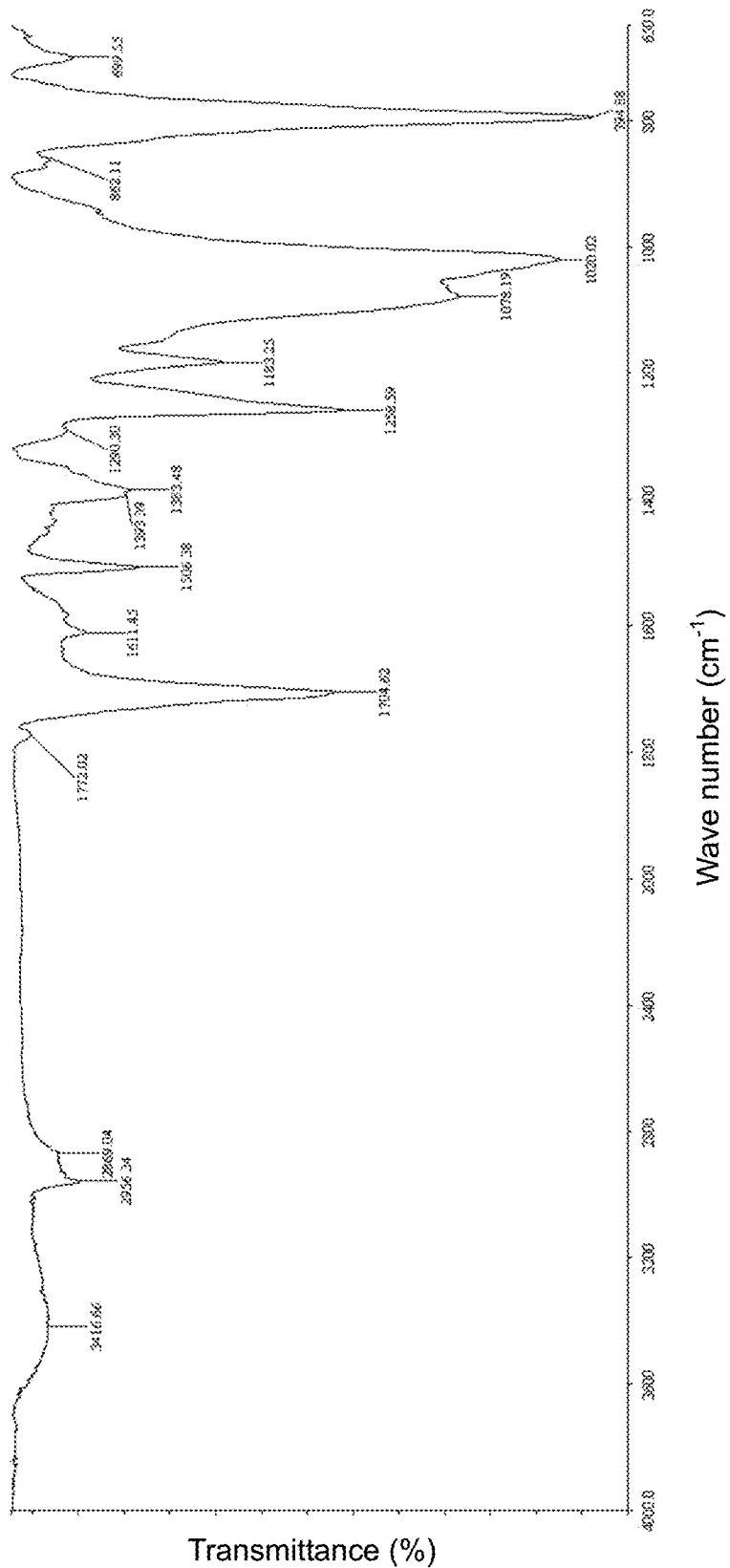
FIGS. 3-13 are infrared absorption spectra illustrating the positions of infrared absorption peaks of the cover layer units having the photosensitive openings in the circuit boards having the photosensitive openings from Application Examples 1 to 11, respectively.
Figure 4:
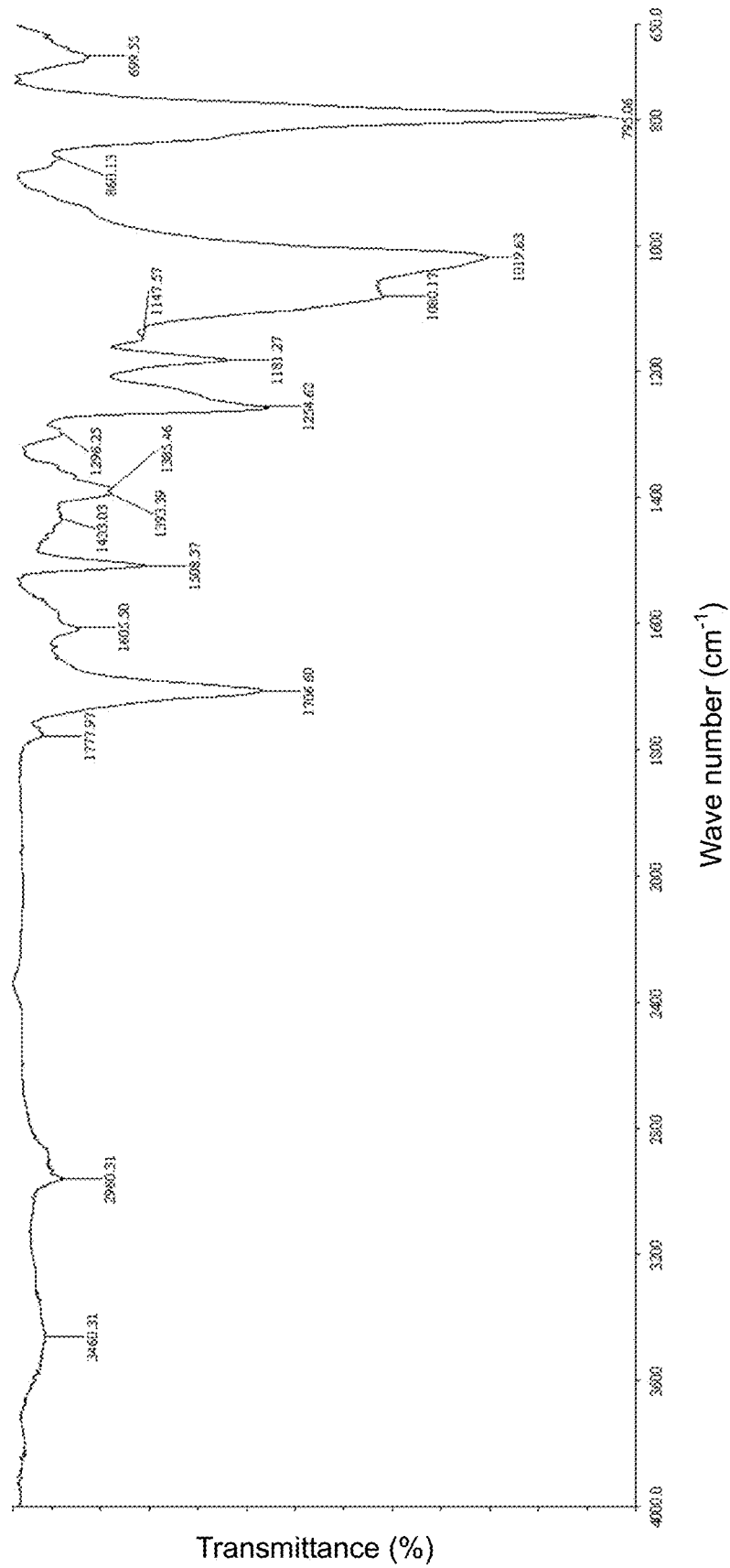
Figure 5:
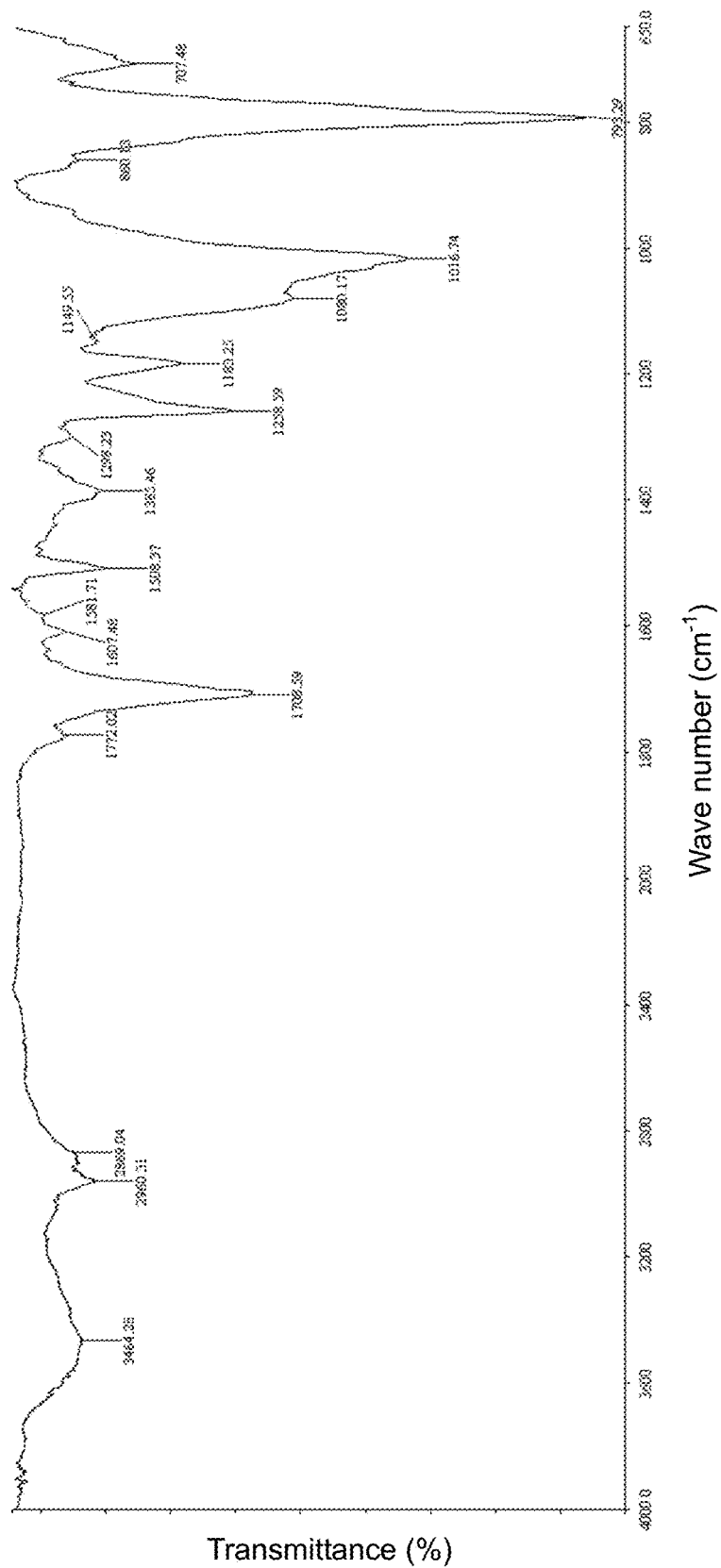
Figure 6:
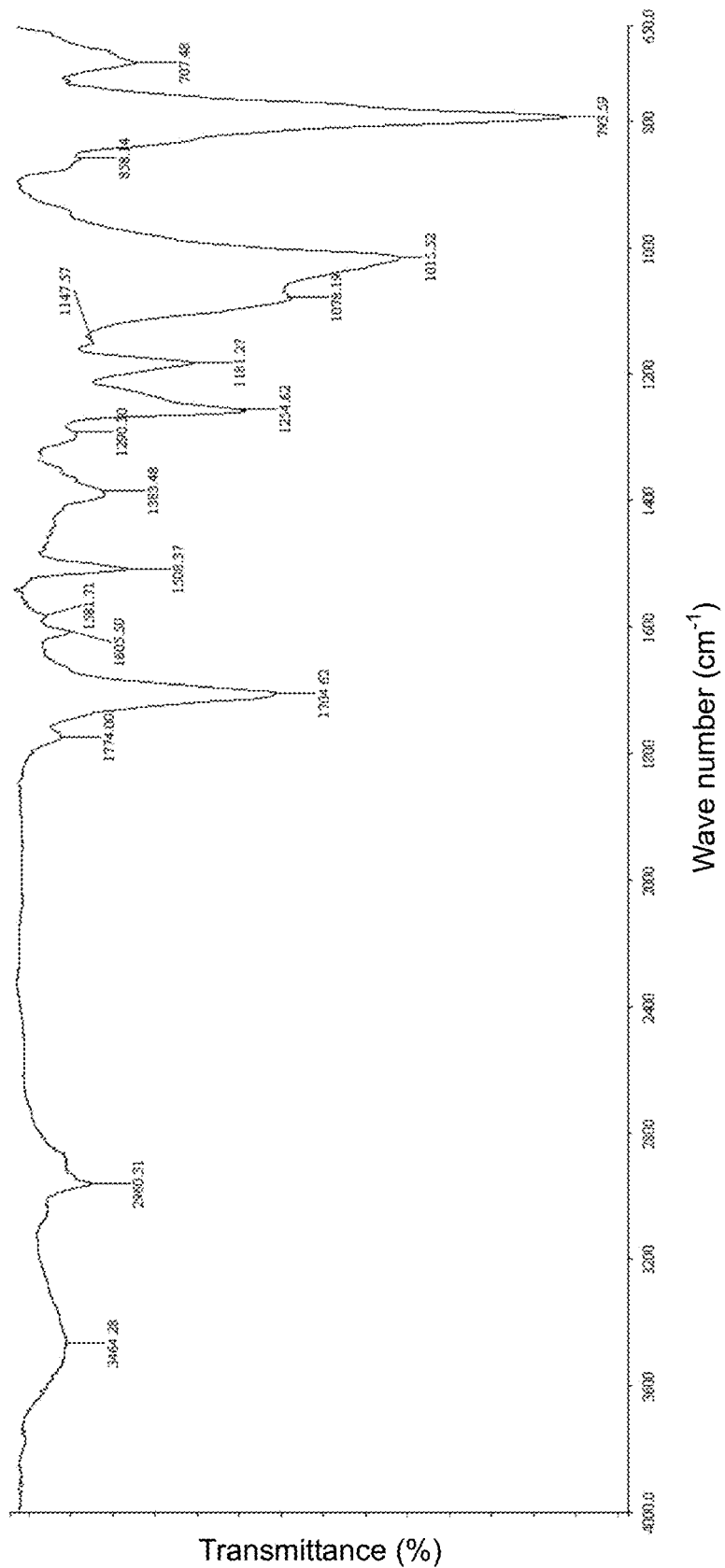
Figure 7:
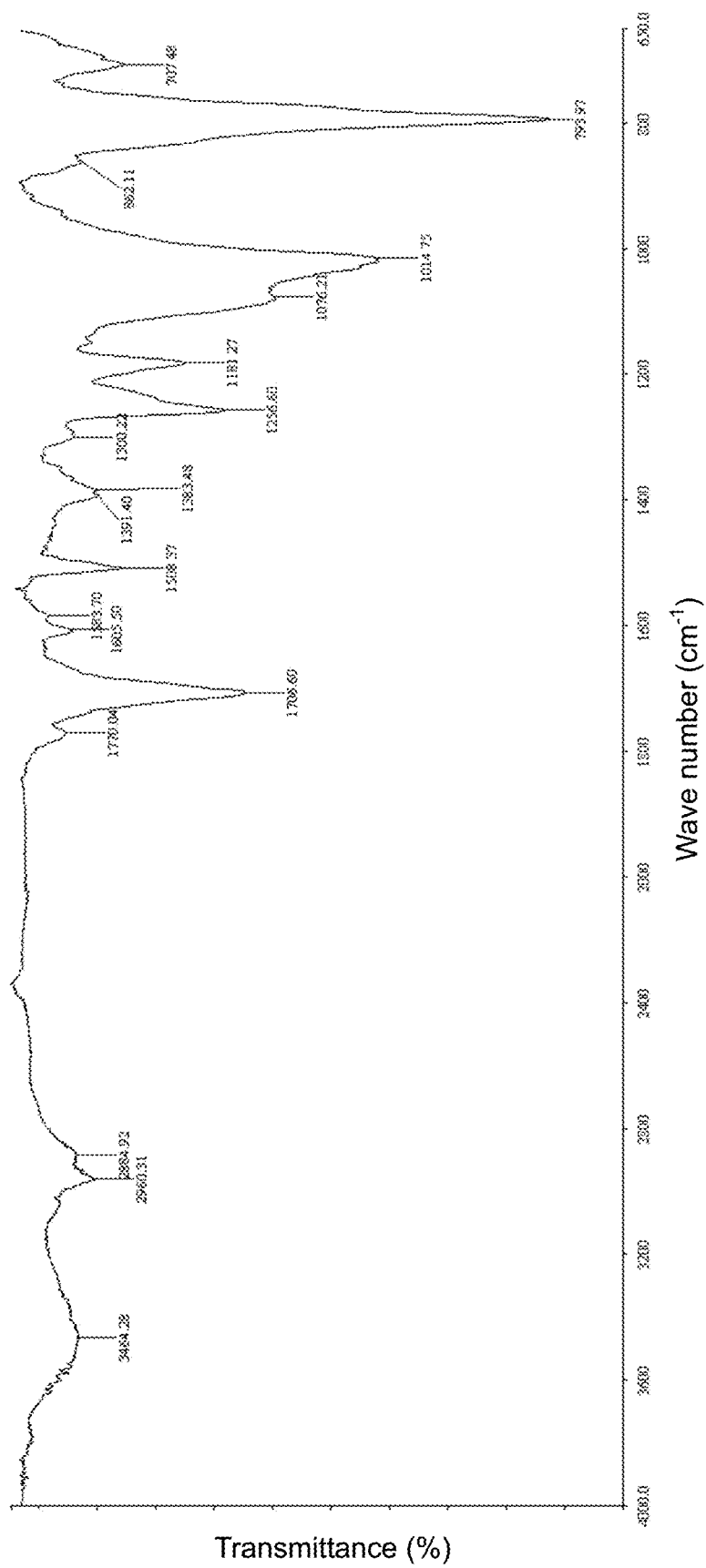
Figure 8:
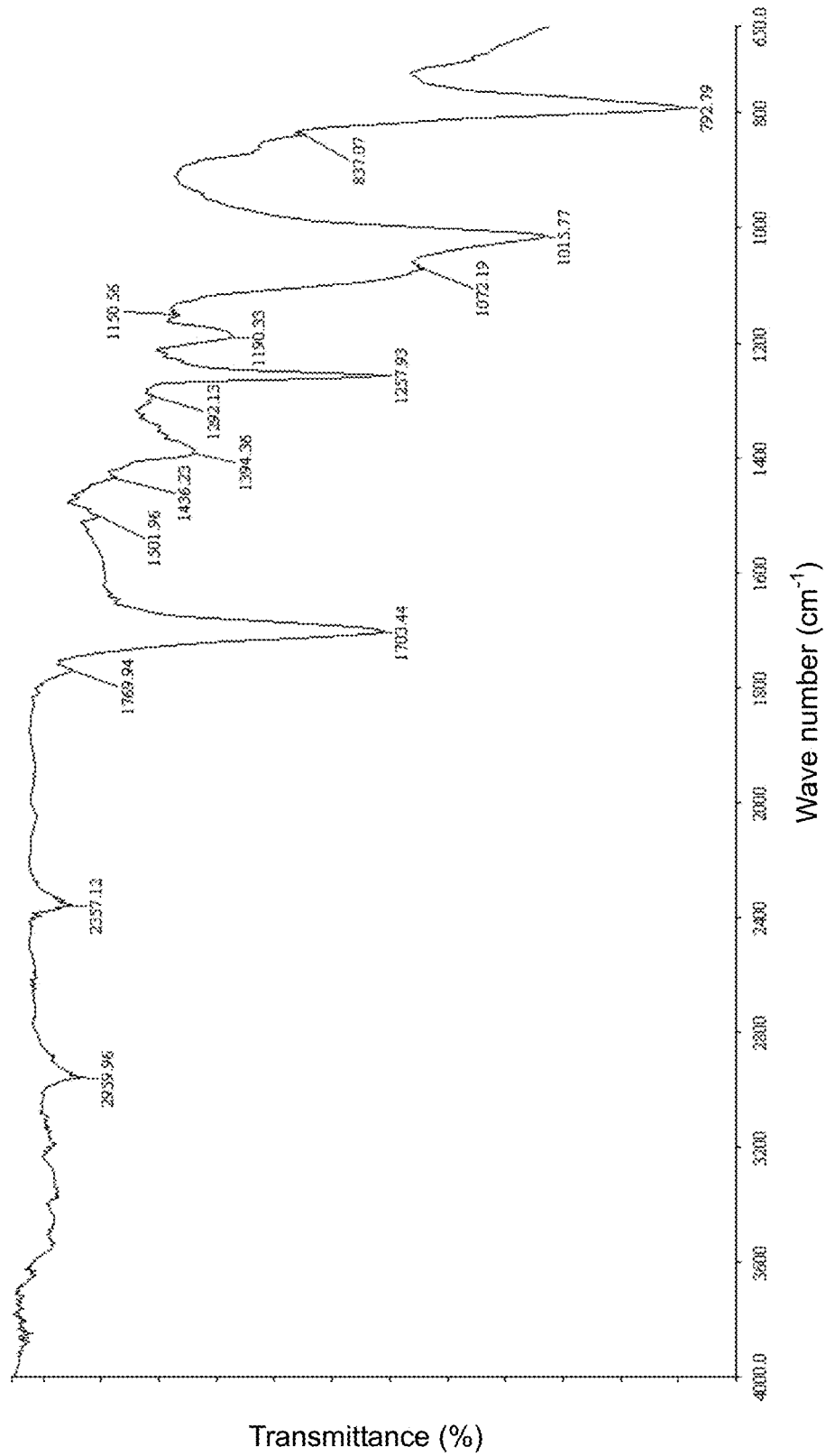
Figure 9:
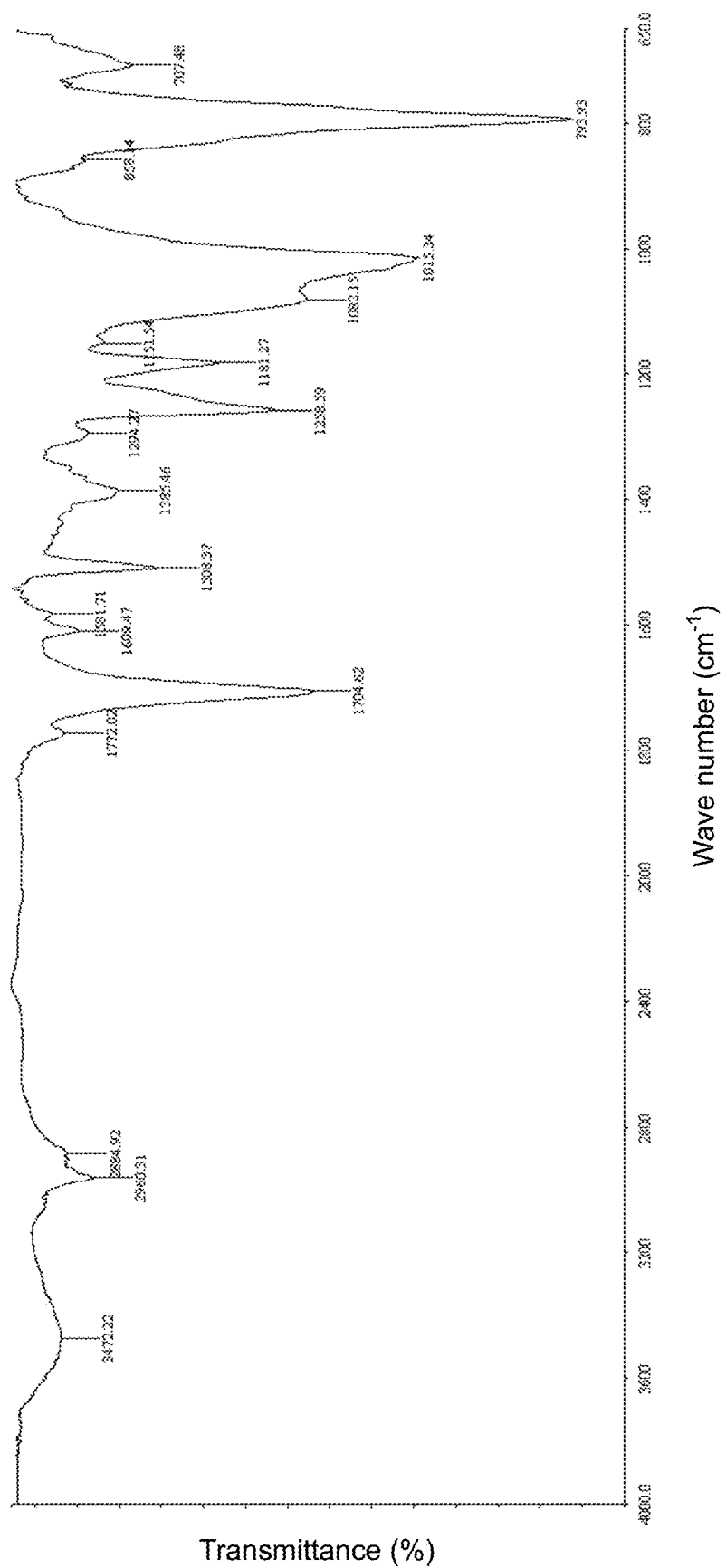
Figure 10:
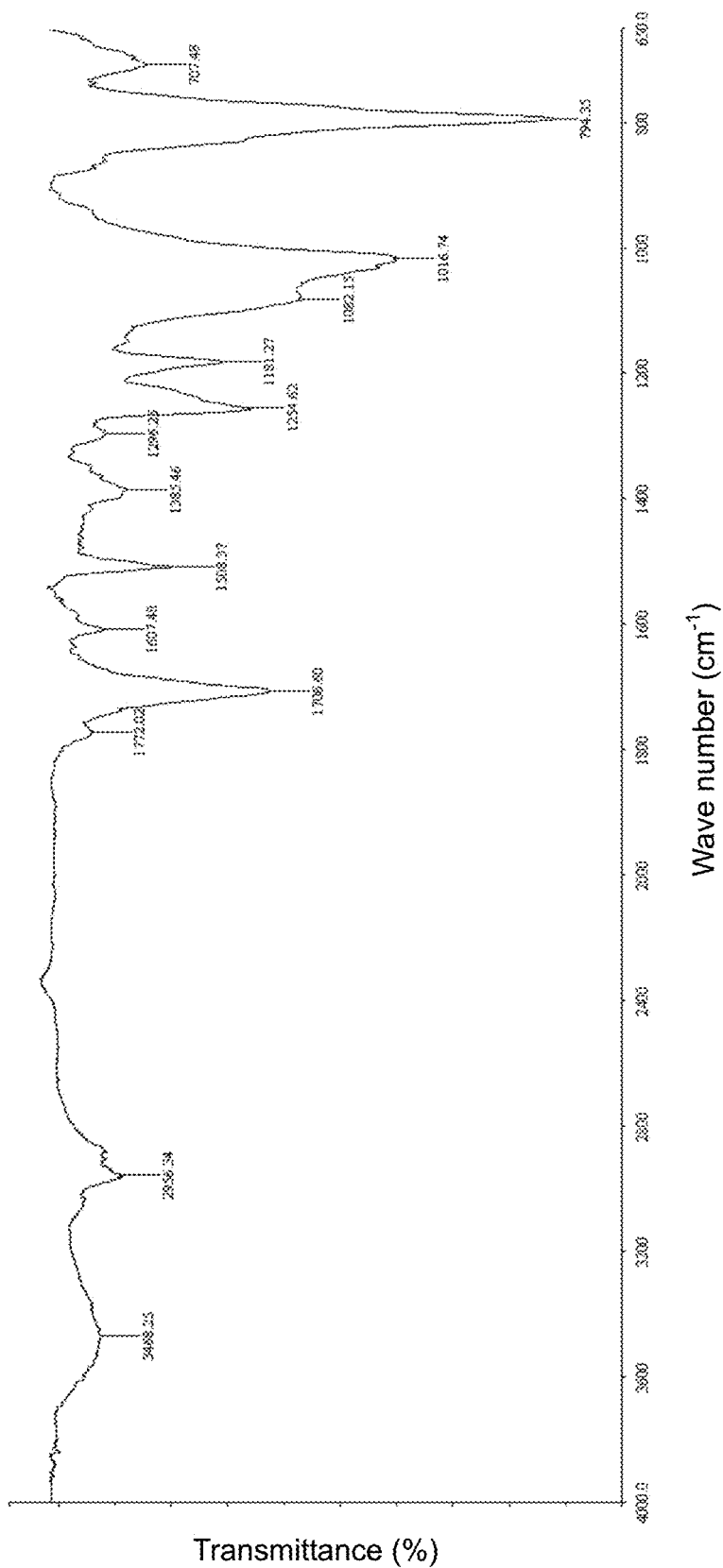
Figure 11:
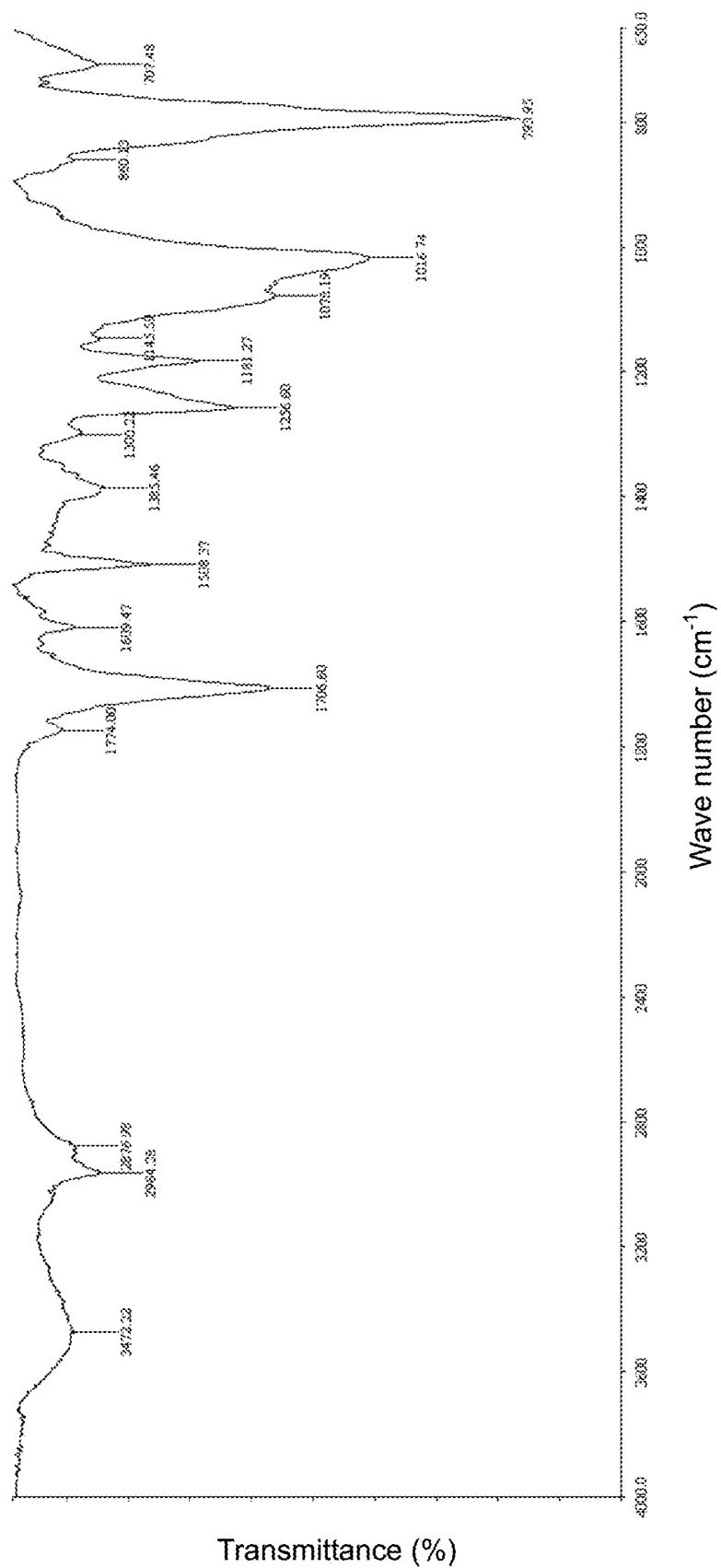
Figure 12:
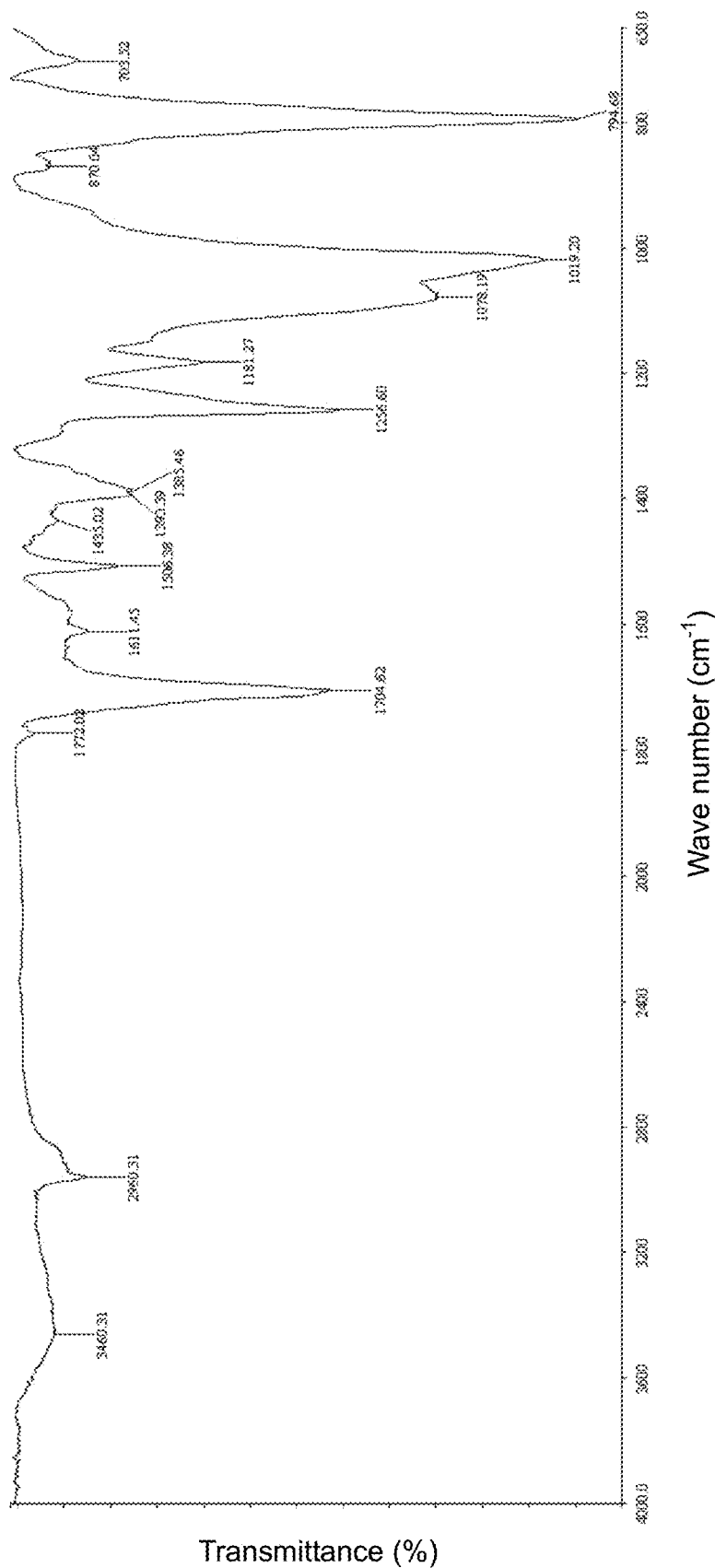
Figure 13:
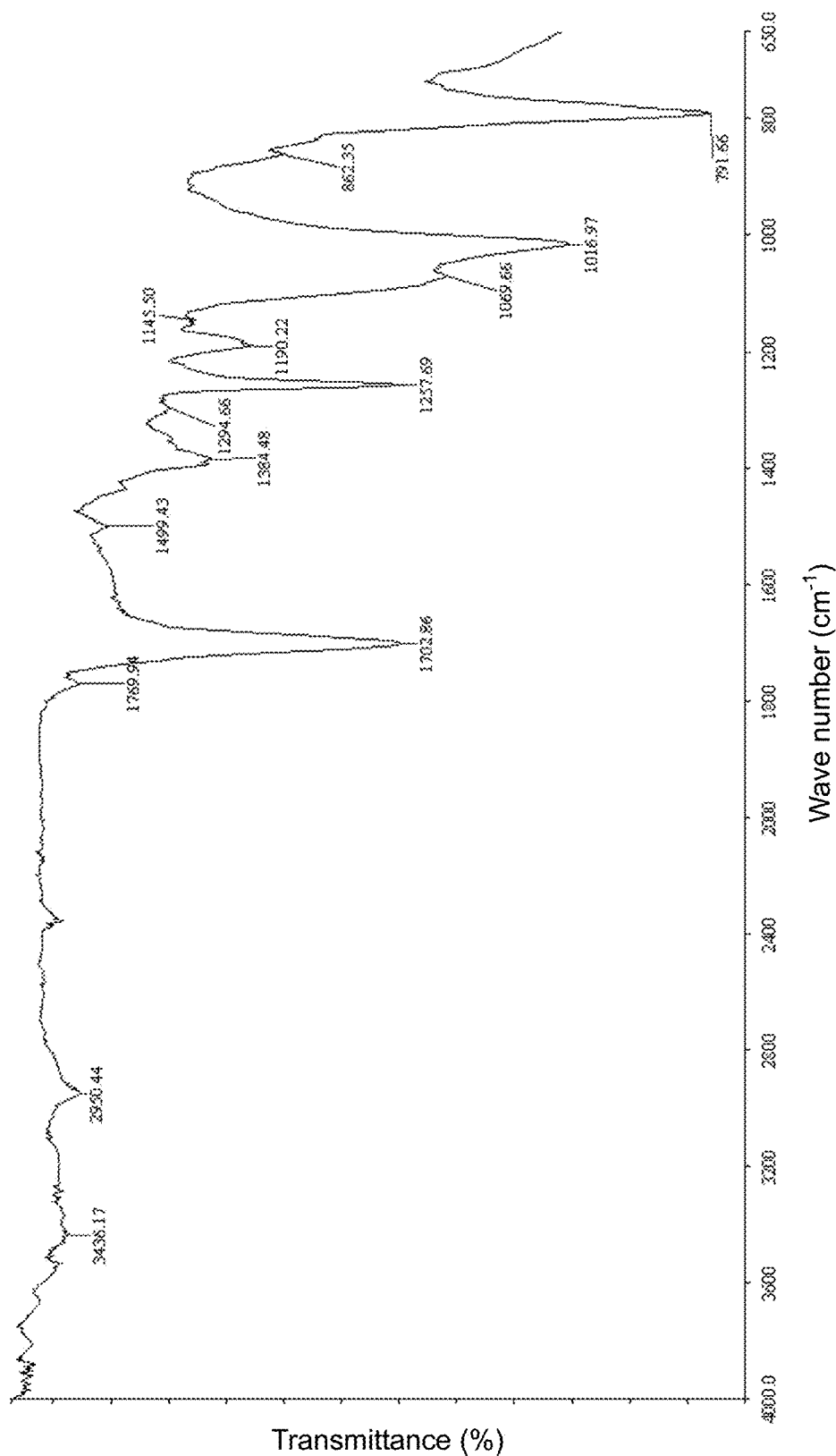
Figure 14:
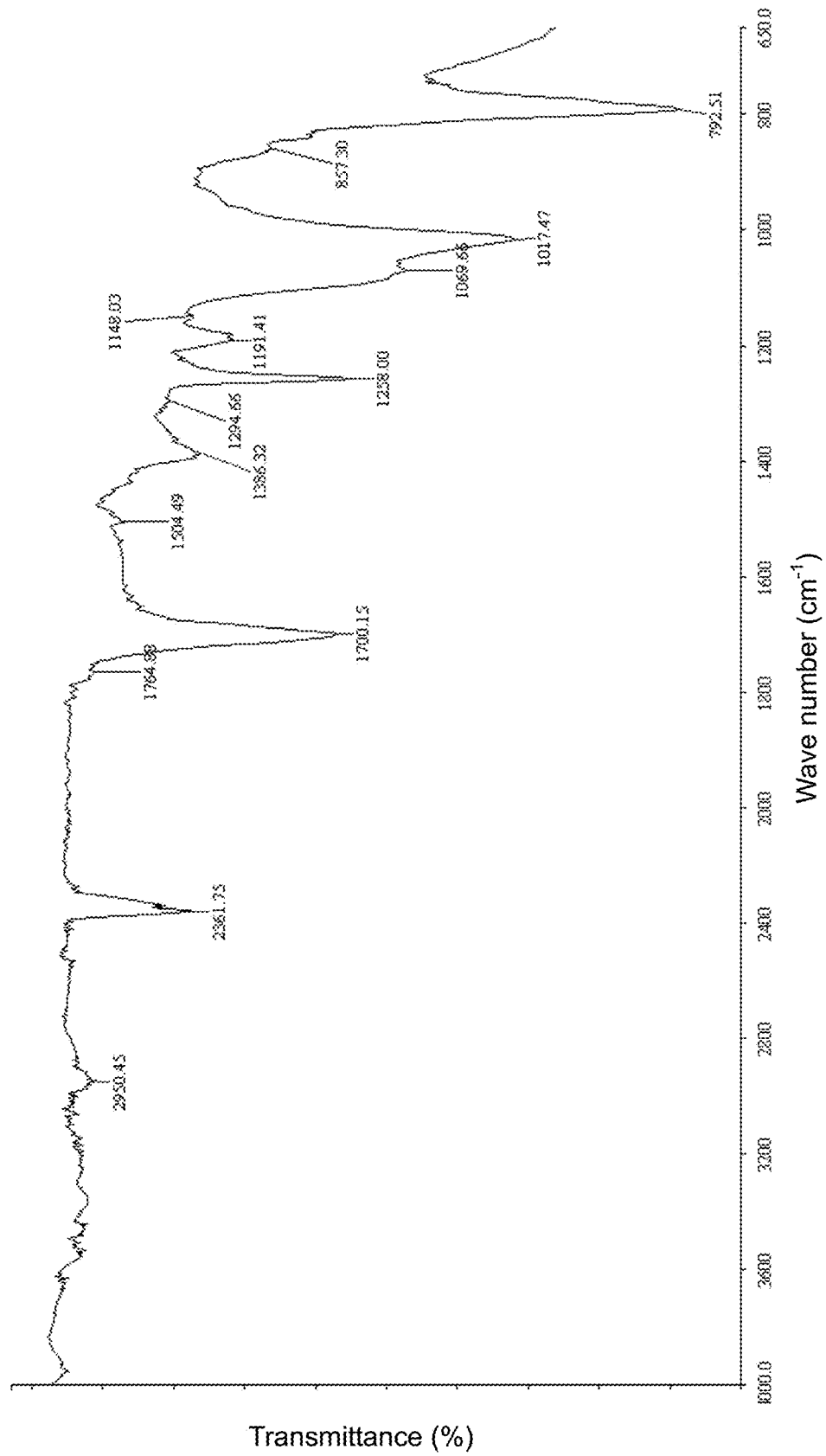
FIGS. 14-17 are infrared absorption spectra illustrating the positions of infrared absorption peaks of the cover layer units having the photosensitive openings in the circuit boards having the photosensitive openings from Comparative Application Examples 1 to 4, respectively.
Figure 15:
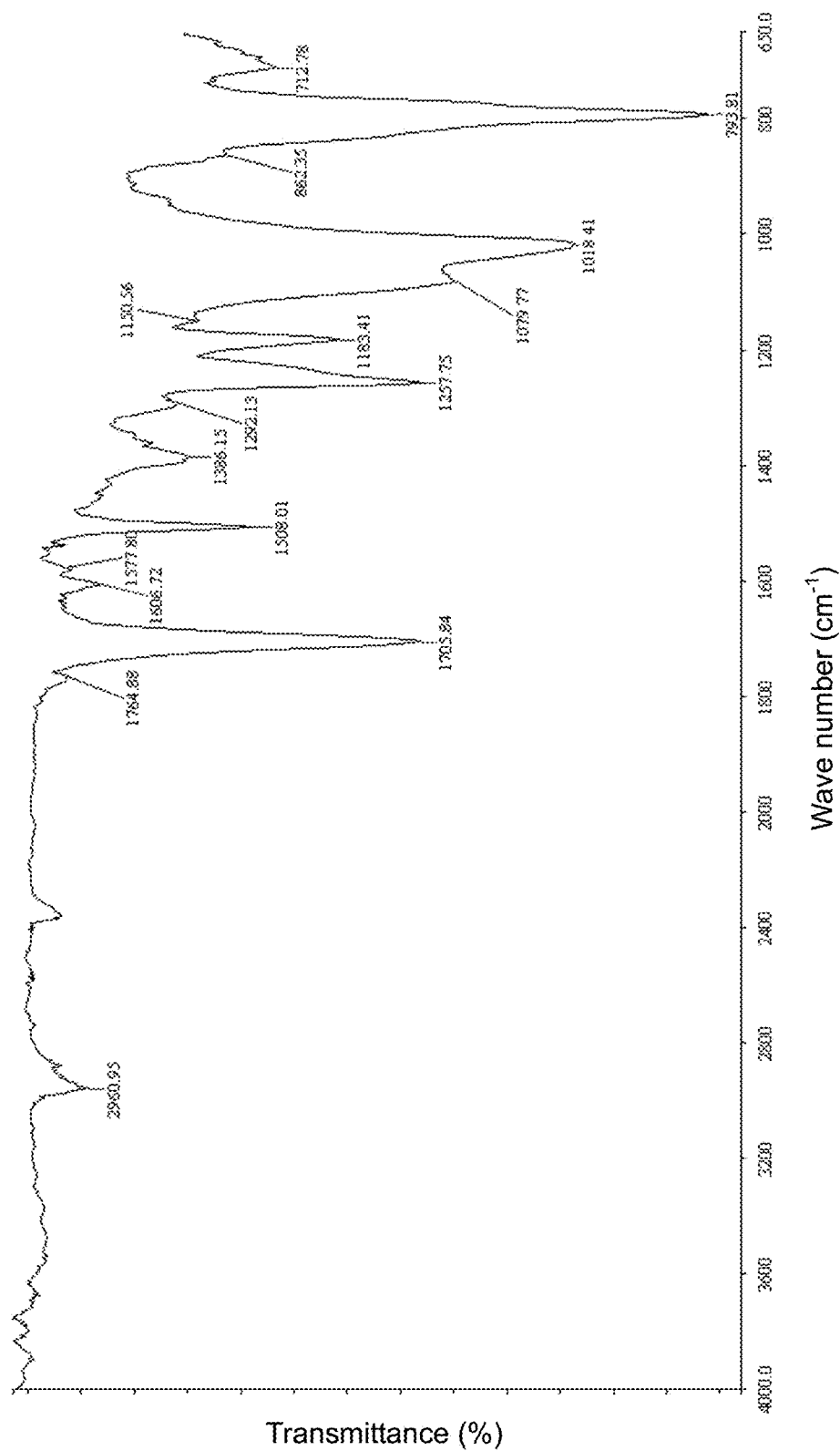
Figure 16:
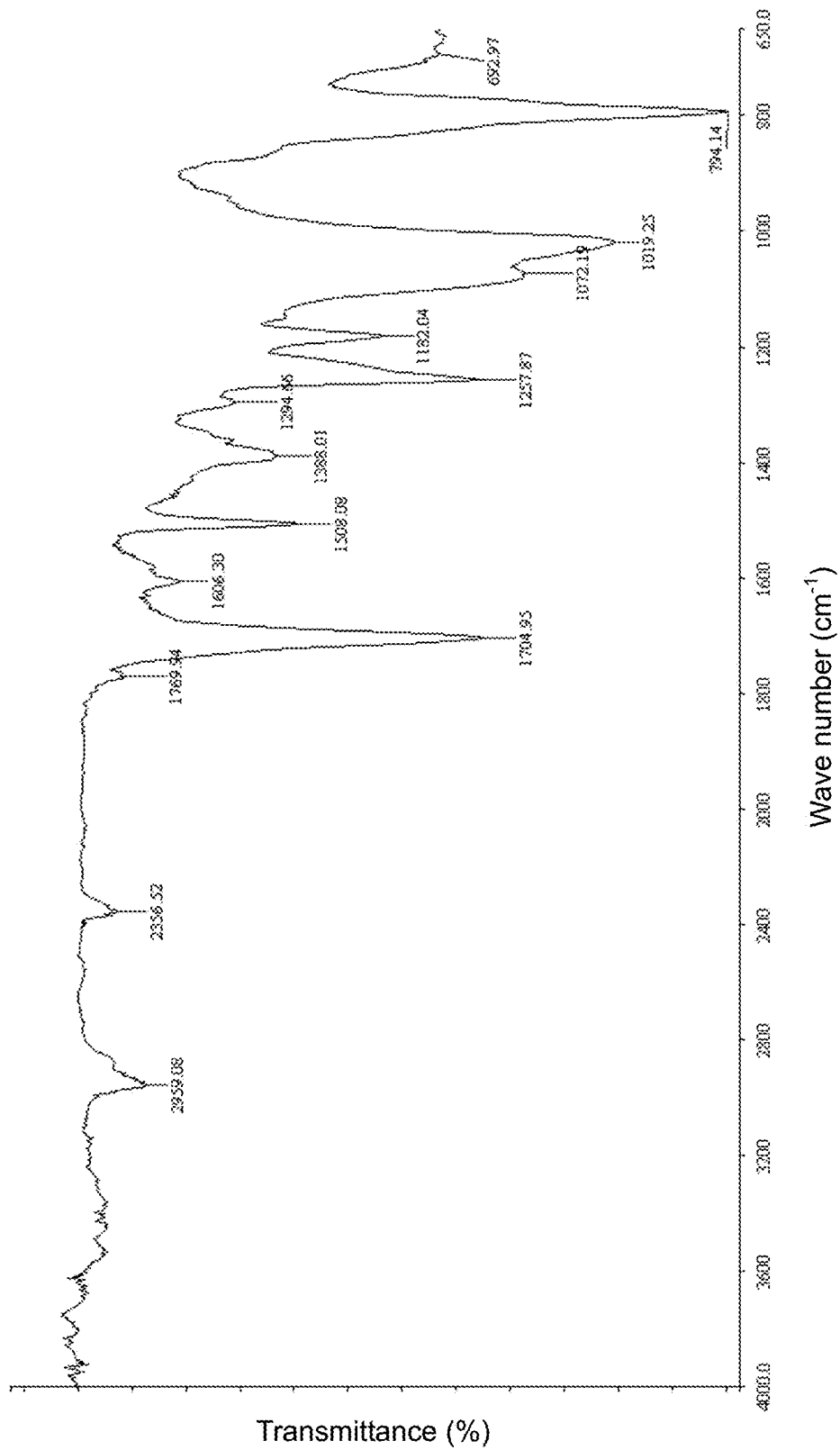
Figure 17:
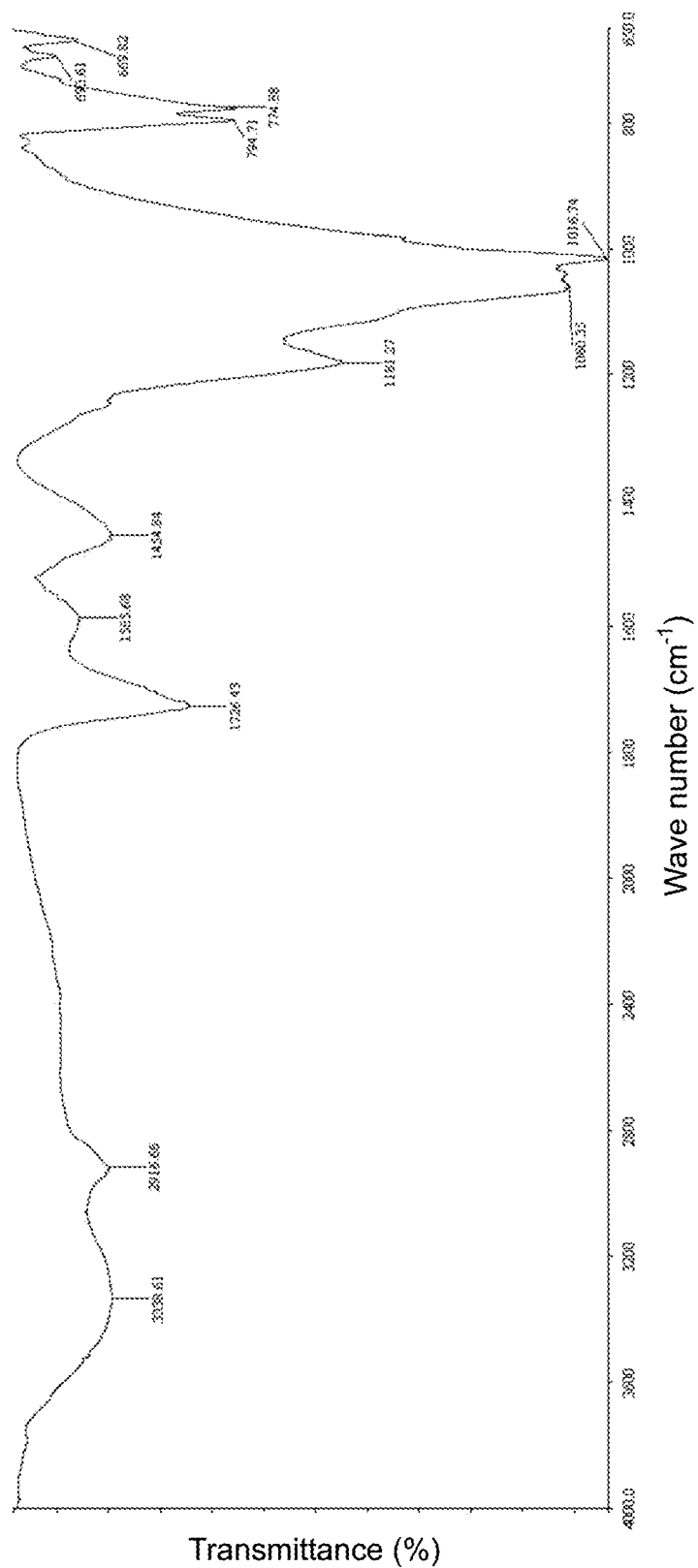

The photosensitive and via-forming circuit board of Embodiment 1 was irradiated with the mercury arc lamp having a wavelength between 250 nm and 400 nm to perform the exposure treatment. The exposure energy of the exposure treatment was 800 mJ, and the exposure duration was 18 seconds. Then, development was carried out at 30° C. for 60 seconds by using a 1.5 wt % aqueous solution of sodium carbonate as the developer. Next, the circuit board was washed with deionized water for 30 seconds and dried with the air gun. Finally, the circuit board was baked in the oven with hot air circulation at 200° C. for 60 minutes to obtain the circuit board having the photosensitive opening, wherein the cover layer unit was formed into the cover layer unit having the photosensitive opening of 20 μm. The positions of the infrared absorption peaks of the cover layer unit having the photosensitive opening in the circuit board having the photosensitive opening from Application Example 1 could be referred to FIG. 3.

Application Examples 2 to 11 and Comparative Application Examples 1 to 4

The steps for preparing the circuit boards having the photosensitive openings from Application Examples 2 to 11 and Comparative Application Examples 1 to 4 were the same as those for Application Example 1, except that the kind of the photosensitive and via-forming circuit board was varied as shown in Table 1. The positions of the infrared absorption peaks of the cover layer units having the photosensitive openings in the circuit boards having the photosensitive openings from Application Examples 2 to 11 and Comparative Application Examples 1 to 4 could be referred to FIGS. 4 to 17, respectively.

<<Evaluation Items>>

Flexibility test: The circuit boards having the photosensitive openings of Application Examples 1 to 11 and Comparative Application Examples 1 to 4 were bent and pressed with a weight of 500 g for 60 seconds, and then, the weight was removed to allow the circuit boards to recover themselves for observing whether the cover layer units having the photosensitive openings cracked or peeled. If not, the circuit board was bent and pressed by the weight for 60 seconds, and then, the weight was removed to allow the circuit board to recover itself for observing again, until the cracking or peeling of the cover layer unit was observed. The number of bending was recorded.

Acid resistance test: The circuit boards having the photosensitive openings of Application Examples 1 to 11 and Comparative Application Examples 1 to 4 were immersed in a 10 wt % hydrochloric acid solution at 25° C. for 30 minutes, respectively, and then rinsed with water and wiped to dry for forming 15 samples to be tested, which were then subjected to the adhesion test according to the standard method of IPC-TM-650 2.4.28.1. The adhesion test was performed by scoring a test area on the surface of the sample using a cutting blade. The test area had 10×10 (100) grids, each had a size of 1 mm×1 mm. Each score line was as deep as the bottom layer of the cover layer unit having the photosensitive opening. The test area was brushed to clean the debris. The grids in the test area were stuck with a 3M 600 tape and applied a pressure of 2 kg to firmly adhere the tape to the test area. Then, the tape was quickly torn off in the vertical direction (90°). The evaluation criteria were as follows:

ISO class 0: The edges of the cuts were completely smooth, and no peeling was observed in the test area.

ISO class 1: Small flakes peeled off the intersections of the cuts, and the percentage of the broken area in the rest area was less than 5%.

ISO class 2: Peeling was observed along the edges or at the intersections of the curs, and the percentage of the broken area in the test area was greater than 5% and less than 15%.

ISO class 3: A portion of peeling was observed along the edges or at the intersections of the cuts or a portion of the grids flaked wholly. The percentage of the broken area in the test area was greater than 15% and less than 35%.

ISO class 4: A large piece peeled along the edges of the cuts or some of the grids flaked partly or wholly, and the percentage of the broken area in the test area was greater than 35% and less than 65%.

ISO class 5: A piece flaked along the edges and at the intersections of the cuts, and the percentage of the broken area in the test area was greater than 65%.

Heat resistance test: The circuit boards having the photosensitive openings from Application Examples 1 to 11 and Comparative Application Examples 1 to 4 were placed in a furnace containing tin at 300° C. and immersed for 10 seconds. After being removed from the furnace, the appearance of the circuit board was observed with a 20× magnification microscope to determine whether the board burst or not. If not, the immersion and observation was performed again until the appearance of the board burst. The number of immersion was recorded.

Measurement of porosity: The circuit boards having the photosensitive openings from Application Example 7, Comparative Application Example 1, and Comparative Application Example 4 were fixed between two acrylic plates, and then ground to the center of through hole by utilizing the cutting force of the sandpaper. The porosity of the cover layer unit at the through-hole position was observed by using a polarizing microscope (Manufacturer: OLYMPUS; Model: BX51). The porosities of the cover layer units of the circuit boards having the photosensitive openings from Application Example 7, Comparative Application Example 1, and Comparative Application Example 4 at the through-hole position were shown in FIGS. 18-20, respectively.

TABLE 1

| The circuit board having the photosensitive opening | | | Application Example | | | | | | | |
|---|---|---|---|---|---|---|---|---|---|---|
| | | | 1 | 2 | 3 | 4 | 5 | 6 | 7 | 8 |
| The photosensitive and via-forming circuit board | | Embodiment | 1 | 2 | 3 | 4 | 5 | 6 | 7 | 8 |
| | | Comparative Embodiment | — | — | — | — | — | — | — | — |
| The photosensitive composition | Preparation Example | | 1 | 2 | 3 | 4 | 5 | 6 | 7 | 8 |
| | Solid content (wt %) | | 63.43 | 67.77 | 67.05 | 65.13 | 71.12 | 59.37 | 57.82 | 63.34 |
| | The constituent containing the photosensitive polyimide (g) | Synthesis Example 1 | 301.72 | 301.72 | 301.72 | 301.72 | 301.72 | 301.72 | — | — |
| | | Synthesis Example 2 | — | — | — | — | — | — | 343.13 | 343.13 |
| | | Synthesis Example 3 | — | — | — | — | — | — | — | — |
| | Epoxy resin (g) | E-1 | 41.48 | 88.03 | — | — | 133.70 | 6.83 | 52.15 | — |
| | | E-2 | — | — | 79.45 | — | — | — | — | 112.18 |
| | | E-3 | — | — | — | 58.28 | — | — | — | — |
| | Photo initiator (g) | P-1 | 3.37 | 3.37 | 3.37 | 3.37 | 3.37 | 3.37 | 3.37 | 3.37 |
| | Epoxy resin/ photosensitive polyimide | | 0.237 | 0.503 | 0.454 | 0.333 | 0.764 | 0.039 | 0.298 | 0.641 |
| Evaluation Items | Number of bending | | 25 | 25 | 30 | 25 | 15 | 20 | 25 | 30 |
| | Acid resistance | | 1 | 1 | 1 | 0 | 2 | 2 | 0 | 0 |
| | Number of immersion | | 7 | 8 | 8 | 8 | 4 | 4 | 7 | 7 |
| | Porosity | | No porosity | No porosity | No porosity | No porosity | No porosity | No porosity | No porosity | No porosity |

| The circuit board having the photosensitive opening | | | Application Example | | | Comparative Application Example | | | |
|---|---|---|---|---|---|---|---|---|---|
| | | | 9 | 10 | 11 | 1 | 2 | 3 | 4 |
| The photosensitive and via-forming circuit board | | Embodiment | 9 | 10 | 11 | — | — | — | — |
| | | Comparative Embodiment | — | — | — | 1 | 2 | 3 | 4 |
| The photosensitive composition | Preparation Example | | 9 | 10 | 11 | 12 | 13 | 14 | — |
| | Solid content (wt %) | | 64.65 | 51.50 | 51.67 | 58.46 | 51.47 | 43.47 | — |
| | The constituent containing the photosensitive polyimide (g) | Synthesis Example 1 | — | — | — | 301.72 | — | — | — |
| | | Synthesis Example 2 | 343.13 | — | — | — | 343.13 | — | — |
| | | Synthesis Example 3 | — | 406.99 | 406.99 | — | — | 406.99 | — |
| | Epoxy resin (g) | E-1 | — | — | — | — | — | — | — |
| | | E-2 | — | 67.90 | — | — | — | — | — |
| | | E-3 | 129.15 | — | 69.65 | — | — | — | — |
| | Photo initiator (g) | P-1 | 3.37 | 3.37 | 3.37 | 3.37 | 3.37 | 3.37 | — |
| | Epoxy resin/ photosensitive polyimide | | 0.738 | 0.388 | 0.398 | — | — | — | — |

TABLE 1-continued

| Evaluation Items | | | | | | | | |
|---|---|---|---|---|---|---|---|---|
| | Number of bending | 20 | 30 | 25 | 20 | 20 | 20 | 5 |
| | Acid resistance | 1 | 1 | 1 | 3 | 3 | 3 | 1 |
| | Number of immersion | 7 | 8 | 8 | 5 | 5 | 5 | 3 |
| | Porosity | No porosity | No porosity | No porosity | With porosity | With porosity | With porosity | With porosity |

E-1: bisphenol A diglycidyl ether;
E-2: dimer acid diglycidyl ester represented by formula (1);
E-3: resorcinol diglycidyl ether;
P-1: phenyl bis(2,4,6-trimethylbenzoyl)-phosphine oxide.

Figure 18:
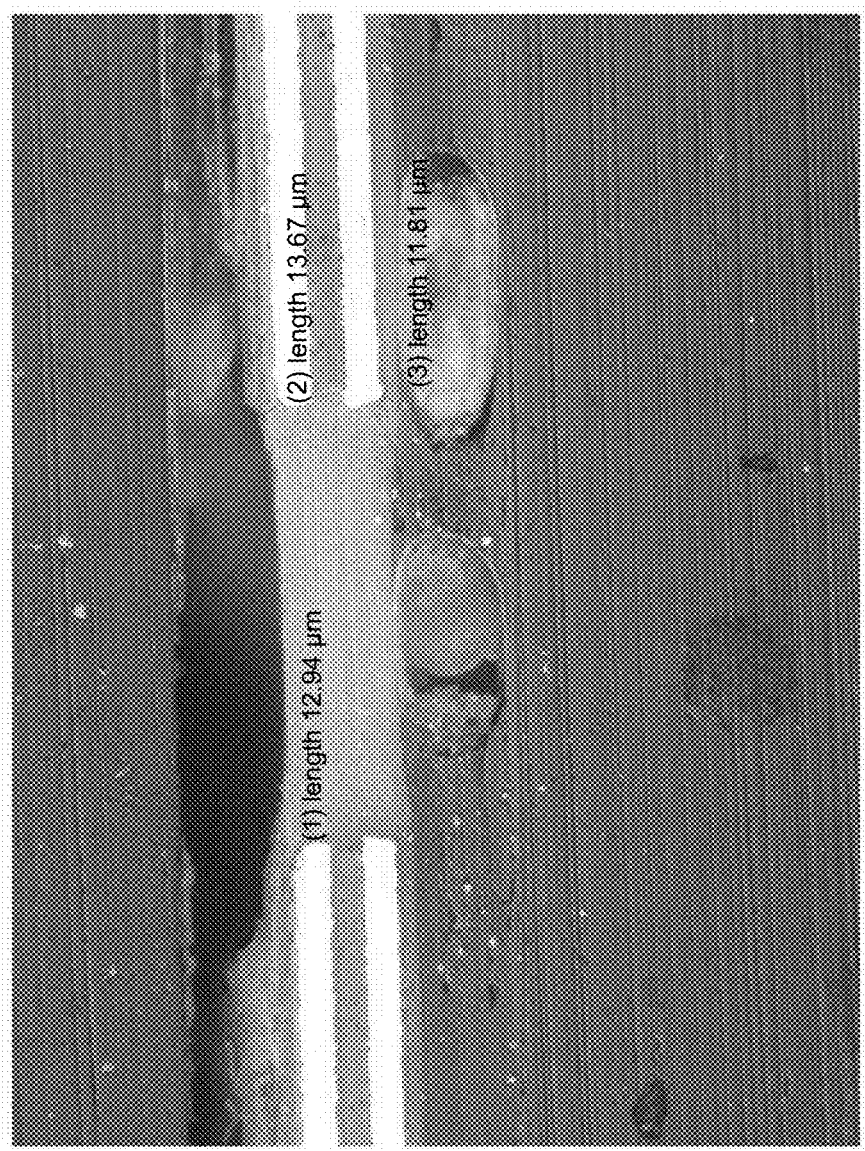
FIGS. 18-20 are photographs illustrating the porosity of the cover layer units at the through-hole positions in the circuit boards having the photosensitive openings from Application Example 7, and Comparative Application Example 1 and Comparative Application Example 4, respectively.
Figure 19:
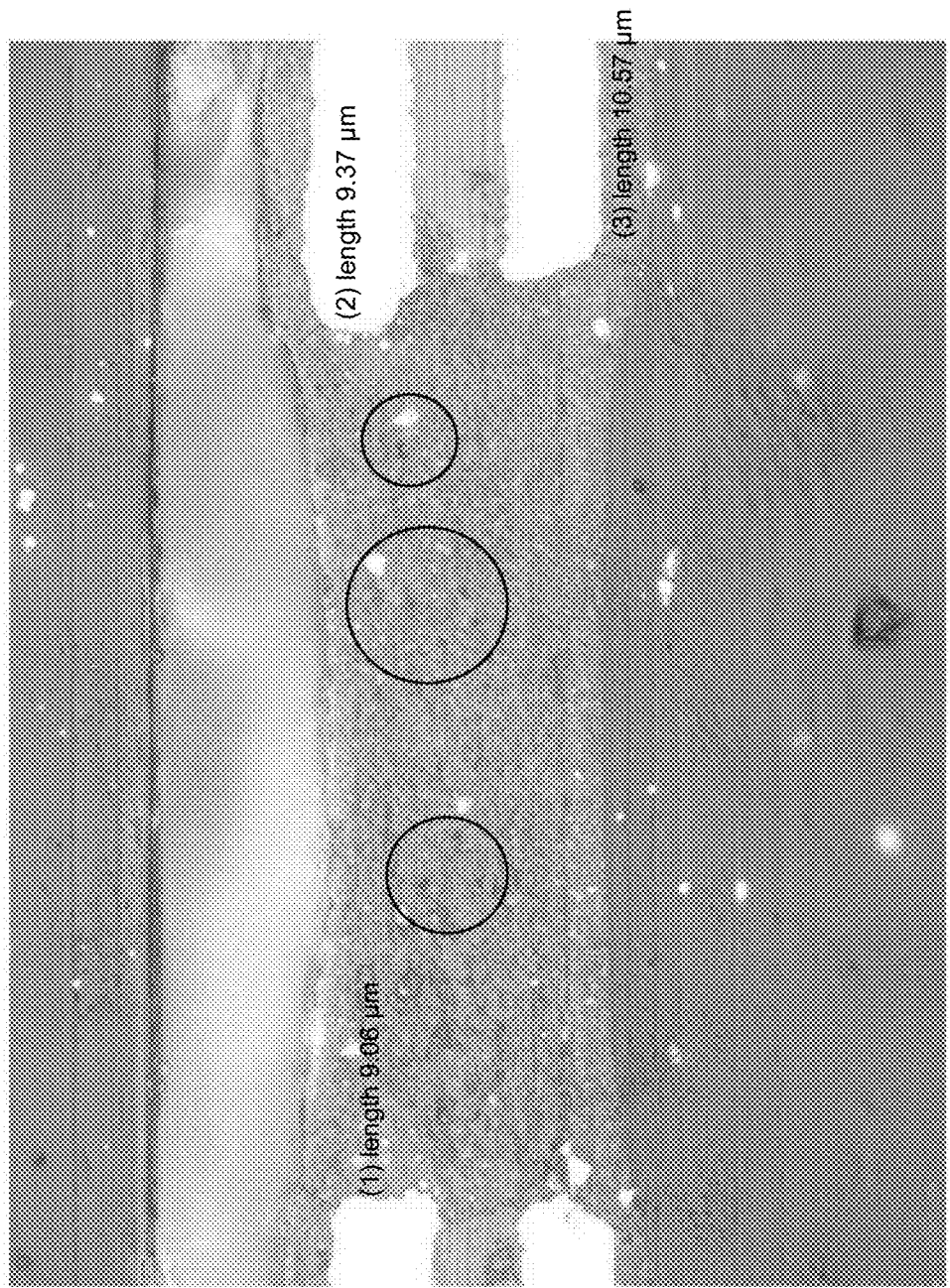
Figure 20:
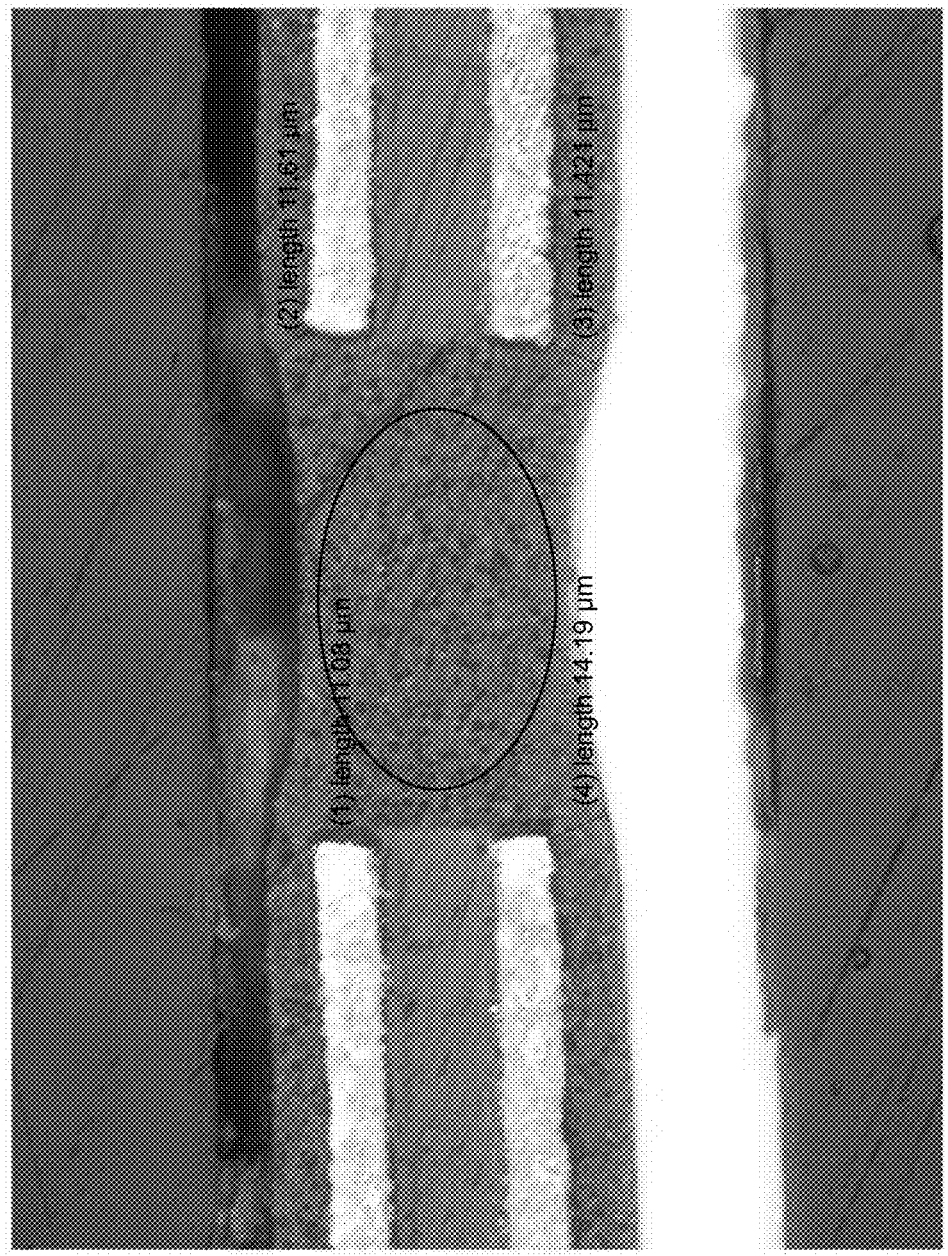

Referring to FIGS. 18 to 20, it could be seen that the cover layer units of the circuit boards having the photosensitive openings from Comparative Application Examples 1 and 4 had porosity at the through-hole positions, as shown in the circle, such that the circuit boards having the photosensitive openings might have the problem of burst during the heat resistance test. Nevertheless, the cover layer unit of the circuit board having the photosensitive openings and formed from the photosensitive and via-forming circuit board of the present invention didn't have porosity at the through-hole position, so no burst problem would occur.

In view of the above, in addition to the function of protecting the first conductive wiring layer and the second conductive wiring layer, the cover layer unit of the photosensitive and via-forming circuit board of the present invention can also serve as the plug piece for the through hole of the laminate unit. After being subjected to the lithography process, the photosensitive and via-forming circuit board of the present invention can be formed with the cover layer unit having the photosensitive opening filled with the photosensitive composition, due to which the circuit board having the photosensitive opening can have heat resistance and flexibility, resulting in the achievement of the objects of the present invention.

Those described above are merely embodiments of the present invention, and cannot be used to limit the scope of the implementation of the present invention. Any simple equivalent variations and modifications made in accordance with the contents of the claims and the specification of the present invention are still within the scope of the present invention.

What is claimed is:

1. A photosensitive and via-forming circuit board, comprising:
   a laminate unit including an insulating layer, a first conductive wiring layer and a second conductive wiring layer formed at two opposite sides of the insulating layer, respectively, and a through-hole surface defining a through hole extending from the upper surface of the first conductive wiring layer through the insulating layer to the lower surface of the second conductive wiring layer;
   a conductor unit formed on the through-hole surface and electrically connecting the first conductive wiring layer and the second conductive wiring layer; and
   a cover layer unit including a first cover layer and a second cover layer formed on the first conductive wiring layer and the second conductive wiring layer of the laminate unit, respectively, and extending into and together completely filling the through hole, wherein the cover layer unit is formed from a photosensitive composition, and the photosensitive composition comprises an epoxy group-containing compound and a photosensitive polyimide capable of reacting with the epoxy group of the epoxy group-containing compound,
   wherein the photosensitive polyimide is a photosensitive polyimide having the structure of formula (I);

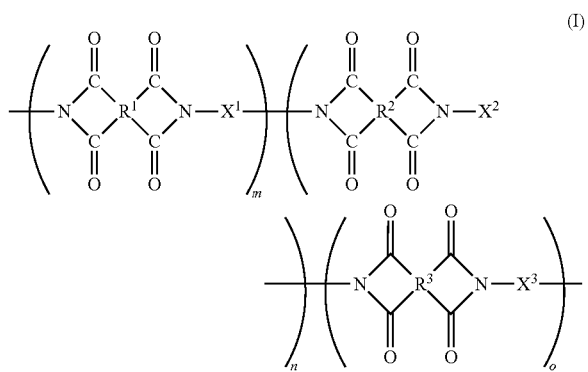

$R^1$, $R^2$ and $R^3$ are each a tetravalent group;
$X^1$ is a divalent group;
$X^2$ is a divalent group having a carboxylic acid group;
$X^3$ is a divalent group having (2-hydroxyl-3-acrylate) propyl group or a divalent group having (2-hydroxyl-3-methacrylate)propyl group;
m is a positive integer from 30 to 70, n is a positive integer from 10 to 45, and o is a positive integer from 10 to 35, based on 100 of the sum of m+n+o;
wherein the plural $R^1$s are the same or different, the plural $X^1$s are the same or different, the plural $R^2$s are the same or different, the plural $X^2$s are the same or different, the plural $R^3$s are the same or different, and the plural $X^3$s are the same or different.

2. The photosensitive and via-forming circuit board of claim 1, wherein the content of the epoxy group-containing compound ranges from 10 wt % to 70 wt %, based on 100 wt % of the photosensitive polyimide.

3. The photosensitive and via-forming circuit board of claim 1, wherein the divalent group having the carboxylic acid group is

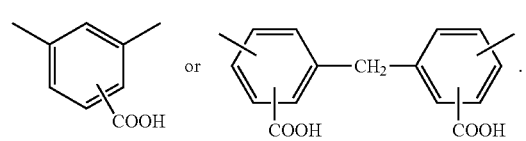

4. The photosensitive and via-forming circuit board of claim 1, wherein the divalent group is

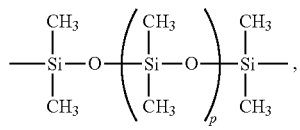

wherein p is from 1 to 20,

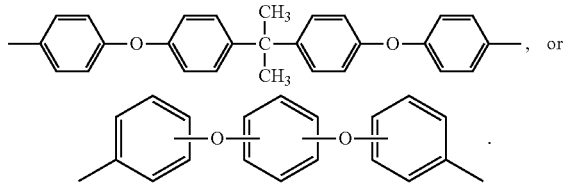

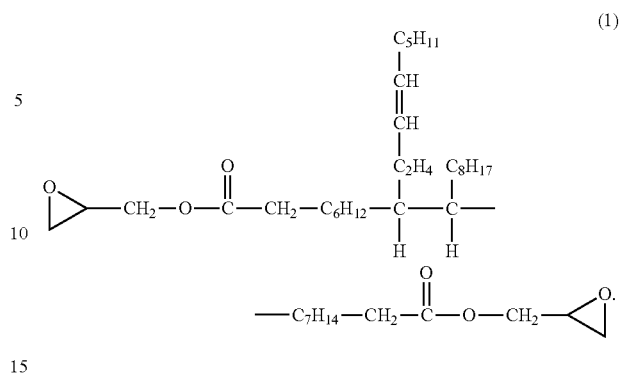

5. The photosensitive and via-forming circuit board of claim 1, wherein the epoxy group-containing compound is selected from neopentyl glycol diglycidyl ether, 1,4-butanediol diglycidyl ether, diglycidyl 1,2-cyclohexanedicarboxylate, bisphenol A diglycidyl ether, 1,2-propanediol diglycidyl ether, trimethylolpropane triglycidyl ether, glycerol propoxylate triglycidyl ether, resorcinol diglycidyl ether, dimer acid diglycidyl ester represented by formula (1), and a combination thereof 6. The photosensitive and via-forming circuit board of claim 1, wherein the hole diameter of the through hole ranges from greater than 0 mm to 0.25 mm.

7. The photosensitive and via-forming circuit board of claim 1, wherein the insulating layer is a flexible insulating layer.

8. The photosensitive and via-forming circuit board of claim 1, wherein the material of the conductor unit is selected from a conductive metal, a conductive polymer, and a combination thereof.

* * * * *